US012694824B2

(12) United States Patent
Huang et al.

(10) Patent No.: US 12,694,824 B2
(45) Date of Patent: Jul. 28, 2026

(54) PIXEL CIRCUITS FOR LIGHT EMITTING ELEMENTS

(71) Applicant: Kunshan Yunyinggu Electronic Technology Co., Ltd., Kunshan (CN)

(72) Inventors: Juin-Wei Huang, Kunshan (CN); Chao-Wei Su, Kunshan (CN); Sheng Kai You, Kunshan (CN); Yu-Kuang Chang, Kunshan (CN); Yu-Hsun Peng, Kunshan (CN)

(73) Assignee: Kunshan Yunyinggu Electronic Technology Co., Ltd., Kunshan (CN)

( * ) Notice: Subject to any disclaimer, the term of this patent is extended or adjusted under 35 U.S.C. 154(b) by 30 days.

(21) Appl. No.: 18/526,029

(22) Filed: Dec. 1, 2023

(65) Prior Publication Data

US 2025/0148972 A1 May 8, 2025

Related U.S. Application Data

(63) Continuation of application No. PCT/CN2023/129814, filed on Nov. 4, 2023.

(51) Int. Cl.
*G09G 3/3225* (2016.01)
*H10K 59/131* (2023.01)

(52) U.S. Cl.
CPC ......... *G09G 3/3225* (2013.01); *H10K 59/131* (2023.02); *G09G 2300/0819* (2013.01); *G09G 2300/0852* (2013.01); *G09G 2310/0262* (2013.01); *G09G 2310/08* (2013.01); *G09G 2320/0233* (2013.01)

(58) Field of Classification Search
None
See application file for complete search history.

(56) References Cited

U.S. PATENT DOCUMENTS 10,210,810 B1 * 2/2019 Wang ................... G09G 3/3233
10,885,843 B1 * 1/2021 Lu ........................ G09G 3/3233
(Continued)

FOREIGN PATENT DOCUMENTS

KR     1020200087711 A     7/2020
KR     1020220092355 A     7/2022
WO       2013179845 A1    12/2013

OTHER PUBLICATIONS

Office Action in related Korean Application No. 10-2024-7000420 dated Oct. 7, 2024 (6 pages).
(Continued)

*Primary Examiner* — Christopher R Lamb
(74) *Attorney, Agent, or Firm* — Bayes PLLC

(57) ABSTRACT

A pixel driving circuit includes a first transistor, a second transistor, and a first capacitor. The first transistor is configured to receive a data signal and drive a light emitting element based on the data signal. The first transistor includes a first gate terminal, a first source terminal, and a first drain terminal. The second transistor includes a second gate terminal receiving a first bias signal from a first bias source, a second source terminal coupled to the first transistor, and a second drain terminal coupled to the light emitting element. The first capacitor is disposed between the first gate terminal and the second gate terminal. The first transistor and the second transistor are different types of transistors.

19 Claims, 30 Drawing Sheets

<u>700</u>

(56)             References Cited

U.S. PATENT DOCUMENTS

| | | | | |
|---|---|---|---|---|
| 2007/0040769 | A1* | 2/2007 | Tai | G09G 3/3233 |
| | | | | 345/76 |
| 2008/0309653 | A1* | 12/2008 | Takahashi | G09G 3/3233 |
| | | | | 345/211 |
| 2014/0264303 | A1* | 9/2014 | Ono | H10D 86/481 |
| | | | | 257/40 |
| 2019/0371244 | A1 | 12/2019 | Peng et al. | |
| 2021/0398487 | A1* | 12/2021 | Toyoda | G09G 3/3233 |
| 2023/0274692 | A1* | 8/2023 | Su | G09G 3/32 |
| | | | | 345/55 |

OTHER PUBLICATIONS

Office Action in related Japanese Application No. 2023-574839 dated Mar. 5, 2026 (3 pages).
Office Action in related Japanese Application No. 2023-574839 dated Nov. 25, 2025 (5 pages).

* cited by examiner

300

VDD

304

306

Max. VGD = VDD-VSS →

←Max. VBD = VDD-VSS-VOLED_MIN

←Min. V_ANODE = VSS+VOLED_Min

302

VSS

400

1100

1500

1700

PIXEL CIRCUITS FOR LIGHT EMITTING ELEMENTS

CROSS-REFERENCE RELATED APPLICATIONS

This application is a continuation of International Application No. PCT/CN2023/129814, filed on Nov. 4, 2023, which is incorporated herein by reference in its entirety.

BACKGROUND

The disclosure relates generally to display technologies, and more particularly, to pixel circuits.

Some display devices may have a requirement to use tandem or triple OLEDs with high cross-voltage driving. In a general complementary metal-oxide semiconductor (CMOS) transistor process, the withstand voltage of the transistors using the threshold voltage (Vth) compensation function architecture to drive the OLED may be 6 volts to 8 volts. When these transistors are used in the pixel driving circuit to drive the tandem or triple OLEDs, the gate-to-drain voltage (VGD) or the body-to-drain voltage (VBD) may exceed the device's withstand voltage.

Hence, the display device may have the Hot Carrier Injection (HCI) effect or current leakage and cause some defects or irregularity situations.

SUMMARY

In one aspect, a pixel driving circuit is disclosed. The pixel driving circuit includes a first transistor, a second transistor, and a first capacitor. The first transistor is configured to receive a data signal and drive a light emitting element based on the data signal. The first transistor includes a first gate terminal, a first source terminal, and a first drain terminal. The second transistor includes a second gate terminal receiving a first bias signal from a first bias source, a second source terminal coupled to the first transistor, and a second drain terminal coupled to the light emitting element. The first capacitor is disposed between the first gate terminal and a second bias source. The first transistor and the second transistor are different types of transistors.

In some implementations, the pixel driving circuit further includes a driving sub-circuit and a data-writing sub-circuit. The driving sub-circuit is coupled to the first gate terminal and the first source terminal to selectively provide a second bias signal by a third bias source to the first transistor. The data-writing sub-circuit is coupled to the driving sub-circuit to selectively provide the data signal to the first transistor.

In some implementations, the pixel driving circuit further includes a second capacitor disposed between the driving sub-circuit and the data-writing sub-circuit.

In some implementations, a scan period of each display frame comprises a reset period and a light emitting period, the driving sub-circuit provides the second bias signal to the first transistor during the light emitting period to drive the light emitting element.

In some implementations, the reset period includes an initialization period, a compensation period, and a data writing period, and the driving sub-circuit provides a first initialization bias signal to the first capacitor during the initialization period.

In some implementations, the data-writing sub-circuit provides a second initialization bias signal to the second capacitor during the initialization period and the compensation period.

In some implementations, the data-writing sub-circuit provides the data signal to the first transistor during the data writing period.

In some implementations, the driving sub-circuit includes a first switch element disposed between the first source terminal and a first terminal of the second capacitor; a second switch element disposed between the first terminal of the second capacitor and the third bias source; and a third switch element disposed between the first terminal of the second capacitor and the first gate terminal.

In some implementations, the driving sub-circuit includes a fourth switch element disposed between the third bias source and a first terminal of the second capacitor; and a fifth switch element disposed between the first terminal of the second capacitor and the first gate terminal.

In some implementations, the driving sub-circuit includes a sixth switch element disposed between the first source terminal and the third bias source; a seventh switch element disposed between the first source terminal and a first terminal of the second capacitor; and an eighth switch element disposed between the first terminal of the second capacitor and a first initialization bias source.

In some implementations, the driving sub-circuit includes a ninth switch element disposed between the first source terminal and the third bias source; a tenth switch element disposed between the first source terminal and a first terminal of the second capacitor; and an eleventh switch element disposed between the first terminal of the second capacitor and the first gate terminal.

In some implementations, the data-writing sub-circuit includes a twelfth switch element disposed between a second terminal of the second capacitor and a data signal source; and a thirteenth switch element disposed between the second terminal of the second capacitor and a second initialization bias source.

In some implementations, the data-writing sub-circuit includes a fourteenth switch element disposed between a second terminal of the second capacitor and a data signal source.

In some implementations, the data-writing sub-circuit and the second capacitor are shared by more than one driving sub-circuit.

In some implementations, the first bias source and the second bias source are provided by different voltage sources. In some implementations, the first bias source and the second bias source are provided by a same voltage source.

In another aspect, a light emitting device is disclosed. The light emitting device includes a light emitting element and a driving circuit for driving the light emitting element. The driving circuit includes a first type transistor receiving a data signal and including a first gate terminal, a first source terminal, and a first drain terminal; a second type transistor including a second gate terminal receiving a first bias signal from a first bias source, a second source terminal coupled to the first drain terminal, and a second drain terminal coupled to the light emitting element; a first capacitor disposed between the first gate terminal and a second bias source; a driving sub-circuit coupled to the first gate terminal and the first source terminal to provide the data signal and a second bias signal by a third bias source; a data-writing sub-circuit coupled to the driving sub-circuit to provide the data signal to the driving sub-circuit; and a second capacitor disposed between the driving sub-circuit and the data-writing sub-circuit.

In some implementations, the first type transistor is a p-type transistor, and the second type transistor is a n-type transistor.

In some implementations, the driving sub-circuit includes a first switch element disposed between the first source terminal and a first terminal of the second capacitor; a second switch element disposed between the first terminal of the second capacitor and the third bias source; and a third switch element disposed between the first terminal of the second capacitor and the first gate terminal.

In some implementations, the driving sub-circuit includes a fourth switch element disposed between the third bias source and a first terminal of the second capacitor; and a fifth switch element disposed between the first terminal of the second capacitor and the first gate terminal.

In some implementations, the driving sub-circuit includes a sixth switch element disposed between the first source terminal and the third bias source; a seventh switch element disposed between the first source terminal and a first terminal of the second capacitor; and an eighth switch element disposed between the first terminal of the second capacitor and a first initialization bias source.

In some implementations, the driving sub-circuit includes a ninth switch element disposed between the first source terminal and the third bias source; a tenth switch element disposed between the first source terminal and a first terminal of the second capacitor; and an eleventh switch element disposed between the first terminal of the second capacitor and the first gate terminal.

In some implementations, the data-writing sub-circuit includes a twelfth switch element disposed between a second terminal of the second capacitor and a data signal source; and a thirteenth switch element disposed between the second terminal of the second capacitor and a second initialization bias source.

In some implementations, the data-writing sub-circuit includes a fourteenth switch element disposed between a second terminal of the second capacitor and a data signal source.

In some implementations, the driving circuit further includes a reset signal coupled to the second drain terminal.

In some implementations, the first bias source and the second bias source are provided by different voltage sources. In some implementations, the first bias source and the second bias source are provided by a same voltage source.

In a further aspect, a method for driving a light emitting element by a pixel circuit is disclosed. The pixel circuit includes a first transistor, a second transistor disposed between the first transistor and the light emitting element, a first capacitor disposed between a first gate terminal of the first transistor and a second gate terminal of the second transistor, and a second capacitor disposed between the first transistor and a data signal source. During an initialization period, a first end of the first capacitor is initialized to a first initialization bias, and a first end of the second capacitor is initialized to a second initialization bias. During a compensation period, the first end of the first capacitor is compensated to a compensation bias. During a data writing period, a data signal is provided to the first end of the second capacitor. During an emitting period, the light emitting element is driven to emit based on the data signal.

In some implementations, the pixel circuit further includes a reset bias source coupled to the second transistor and the light emitting element. During the initialization period, the compensation period, and the data writing period, a reset bias is provided to the pixel circuit by the reset bias source.

In some implementations, a sum of the initialization period, the compensation period, the data writing period, and the emitting period is a frame period.

In some implementations, the first initialization bias is provided to the first end of the first capacitor; a first bias is provided to the second end of the first capacitor; the second initialization bias is provided to the first end of the second capacitor; and the first end of the first capacitor and a second end of the second capacitor are coupled.

In some implementations, the first initialization bias at the first end of the first capacitor is discharged through the first transistor and the second transistor to the reset bias.

In some implementations, a voltage difference between the first end and the second end of the first capacitor is at least a sum of a first threshold voltage of the first transistor and a second threshold voltage of the second transistor.

In some implementations, the compensation bias is at least a sum of a first threshold voltage of the first transistor and a second threshold voltage of the second transistor.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

The present disclosure will be described with reference to the accompanying drawings.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it is contemplated that such feature, structure or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As will be disclosed in detail below, among other novel features, the pixel circuits for light emitting elements, such as organic light emitting elements (OLEDs) and micro-LEDs, disclosed herein can improve a variety of display specifications. It is understood that the light emitting elements described here are for illustration only, and other types of light emitting elements could also be applied.

Figure 1:
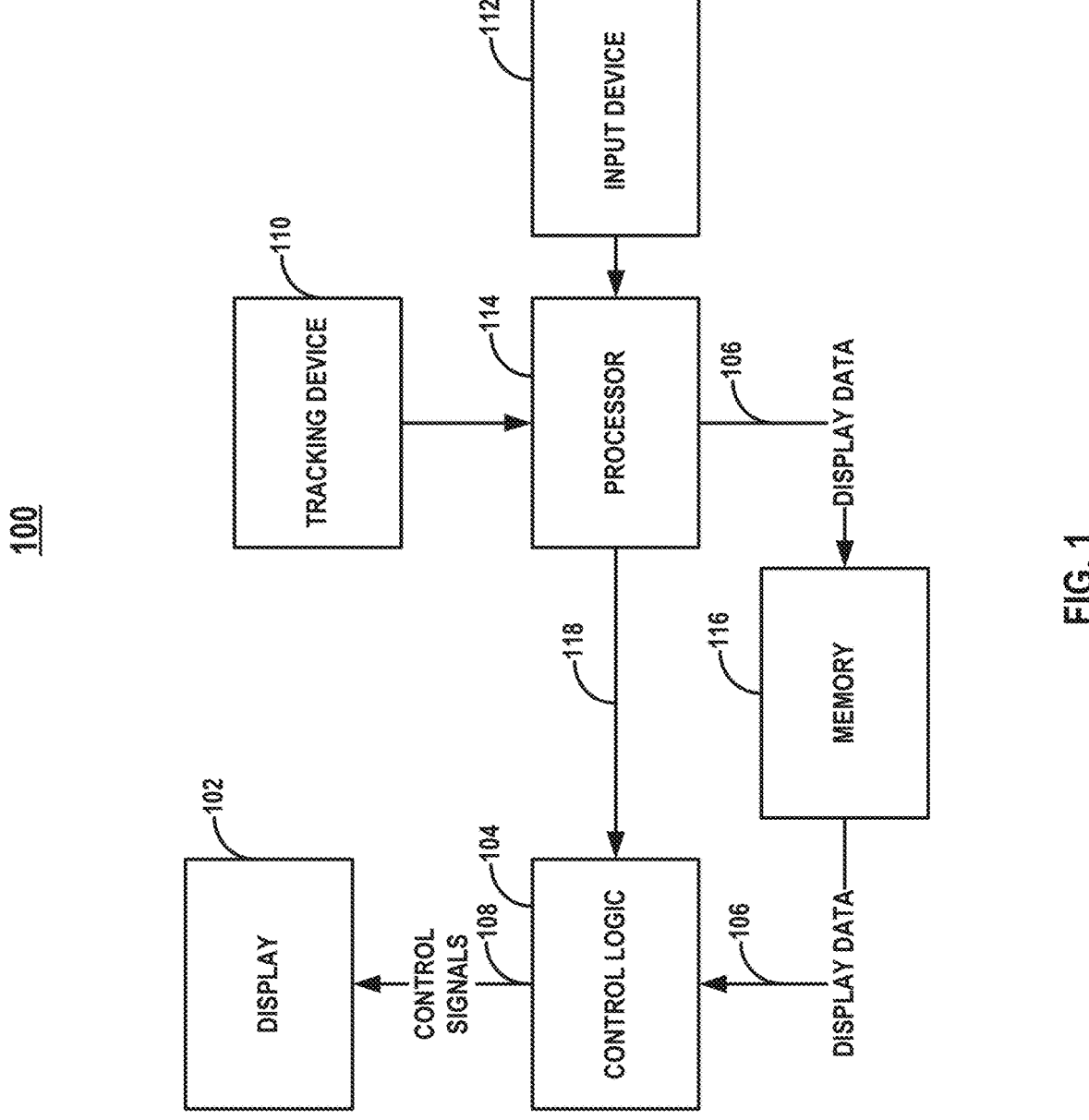
FIG. 1 illustrates an apparatus including a display and control logic, according to some aspects of the present disclosure.

FIG. 1 illustrates an apparatus 100 including a display 102 and control logic 104, according to some aspects of the present disclosure, Apparatus 100 may be any suitable device, for example, a VR, AR, or MR device (e.g., VR headset, etc.), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (IPS), electronic billboard, electronic sign, printer, or any other suitable device. In some implementations, display 102 is operatively coupled to control logic 104 and is part of apparatus 100, such as but not limited to, an HMD, handheld device screen, computer monitor, television screen, dashboard, electronic billboard, or electronic sign. Display 102 may be an OLED display, micro-LED display, liquid crystal display (LCD), E-ink display, electroluminescent display (ELD), billboard display with LED or incandescent lamps, or any other suitable type of display.

Control logic 104 may be any suitable hardware, software, firmware, or combination thereof, configured to receive display data 106 (e.g., pixel data) and generate control signals 108 for driving the subpixels on display 102. Control signals 108 are used for controlling writing of display data 106 to the subpixels and directing operations of display 102. For example, subpixel rendering (SPR) algorithms for various subpixel arrangements may be part of control logic 104 or implemented by control logic 104. Control logic 104 may be implemented as a standalone integrated circuit (IC) chip, such as an application-specific integrated circuit (ASIC) or a field-programmable gate array (FPGA). Apparatus 100 may also include any other suitable components, such as, but not limited to tracking devices 110 (e.g., inertial sensors, camera, eye tracker, GPS receiver, or any other suitable devices for tracking motion of eyeballs, facial expression, head movement, body movement, and hand gesture), input devices 112 (e.g., a mouse, keyboard, remote controller, handwriting device, microphone, scanner, etc.), and speakers (not shown).

In some implementations, apparatus 100 may be a handheld or a VR/AR/MR device, such as a smart phone, a tablet, or a VR headset. Apparatus 100 may also include a processor 114 and memory 116. Processor 114 may be, for example, a graphics processor (e.g., graphics processing unit (GPU)), an application processor (AP), a general processor (e.g., APU, accelerated processing unit; GPGPU, general-purpose computing on GPU), or any other suitable processor. Memory 116 may be, for example, a discrete frame buffer or a unified memory. Processor 114 is configured to generate display data 106 in display frames and may temporally store display data 106 in memory 116 before sending it to control logic 104. Processor 114 may also generate other data, such as but not limited to, control instructions 118 or test signals, and provide them to control logic 104 directly or through memory 116. Control logic 104 then receives display data 106 from memory 116 or from processor 114 directly.

Figure 2:
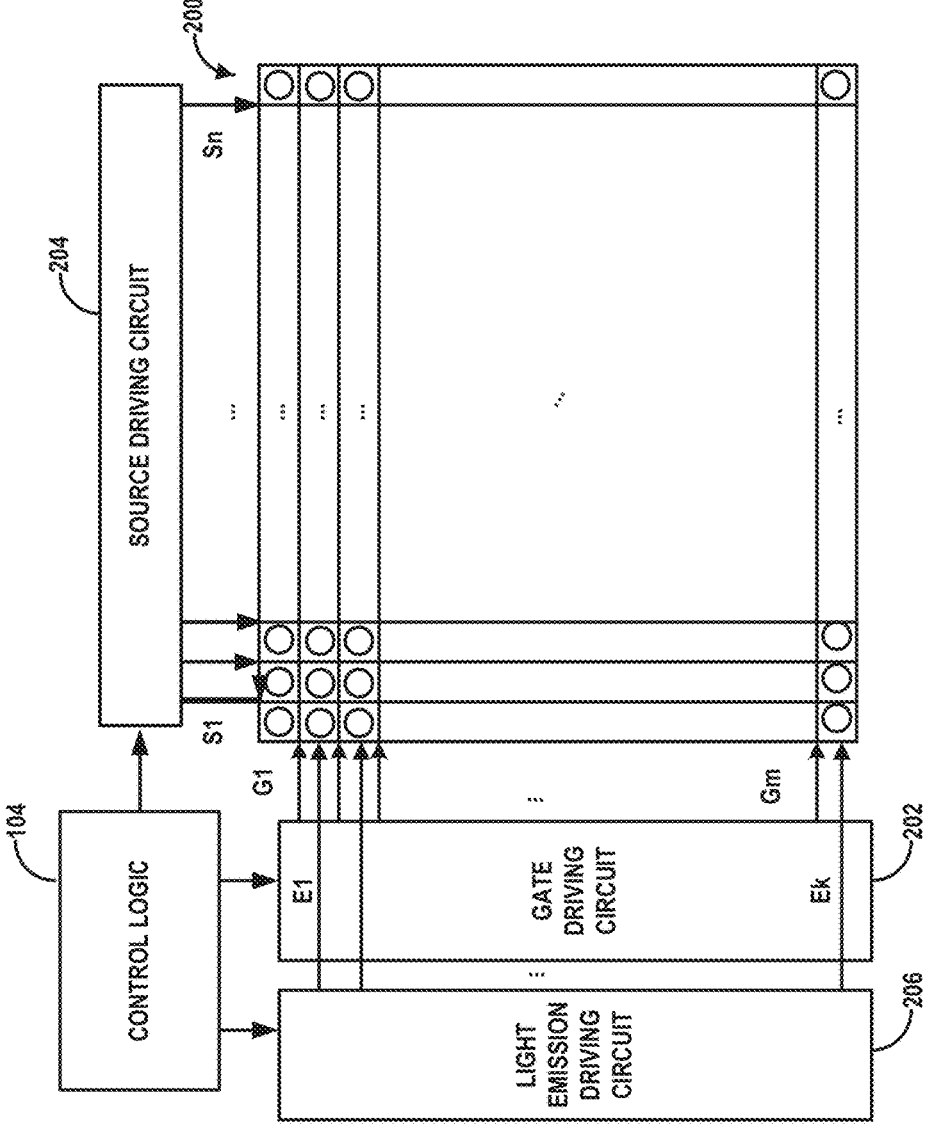
FIG. 2 illustrates a block diagram of the display shown in FIG. 1, according to some aspects of the present disclosure.

FIG. 2 illustrates a block diagram of display 102 shown in FIG. 1 including driving circuits, according to some aspects of the present disclosure. In some implementations, display 102 may include a display panel having an active region 200 including a plurality of subpixels. The display panel may also include on-panel driving circuits, e.g., a gate driving circuit 202 and a source driving circuit 204. It is to be appreciated that in some implementations, gate driving circuit 202 and source driving circuit 204 may not be on-panel driving circuits, i.e., not parts of the display panel, but instead are operatively coupled to the display panel.

Each subpixel may be any of the units that make up a pixel, i.e., a subdivision of a pixel. For example, a subpixel may be a single-color display element that can be individually addressed. In some implementations in which display 102 is a light emitting element display (e.g., an OLED display or a micro-LED display), each subpixel may include a light emitting element (e.g., an OLED or a micro-LED) and a pixel circuit for driving the light emitting element. The plurality of subpixels (and the light emitting elements thereof) may be arranged in an array having a plurality of rows and columns according to any suitable subpixel arrangement. Each light emitting element can emit light in a predetermined brightness and color, such as but not limited to, red, green, blue, yellow, cyan, magenta, or white. Each pixel circuit includes thin film transistors (TFTs) and capacitor(s) and is configured to drive the corresponding subpixel by controlling the light emitting from the respective light emitting element according to control signals 108 from control logic 104. The pixel circuit may be in a 2T1C configuration (i.e., including a switching transistor, a driving transistor, and a storage capacitor) or may include a compensation circuit with more transistors and/or capacitors for brightness uniformity, such as in a 7T1C, 5T1C, 5T2C, or 6T1C configuration.

In some implementations, gate driving circuit 202 is operatively coupled to active region 200 via a plurality of gate lines G1-Gm (a.k.a. scan lines) and configured to scan the plurality of subpixels. For example, gate driving circuit 202 applies a plurality of scan signals, which are generated based on control signals 108 from control logic 104, to the plurality of gate lines G1-Gm for scanning the plurality of subpixels in a gate scanning order. A scan signal is applied to the gate electrode of a switching transistor of each pixel circuit during the scan period to turn on the switching transistor so that the data signal for the corresponding subpixel can be written by source driving circuit 204. It is to be appreciated that although one gate driving circuit 202 is illustrated in FIG. 2, in some embodiments, multiple gate driving circuits may work in conjunction with each other to scan the subpixels.

In some implementations, source driving circuit 204 is operatively coupled to active region 200 via a plurality of source lines S1-Sn (a.k.a. data lines) and configured to write display data 106 in frames to the plurality of subpixels. For example, source driving circuit 204 may simultaneously apply a plurality of data signals to the plurality of source lines S1-Sn for the subpixels. That is, source driving circuit 204 may include one or more shift registers, digital-analog converters (DAC), multiplexers (MUX), and arithmetic circuit for controlling a timing of application of voltage to the source electrode of the switching transistor of each pixel circuit (i.e., during the scan period in each frame) and a magnitude of the applied voltage according to gradations of display data 106. It is to be appreciated that although one source driving circuit 204 is illustrated in FIG. 2, in some implementations, multiple source driving circuits may work in conjunction with each other to apply the data signals to the source lines for the subpixels.

Additionally, a light emission driving circuit 206 may be included on the display panel. Light emission driving circuit 206 may be operatively coupled to active region 200 and configured to cause each subpixel to emit light for a certain time period in each frame by applying a plurality of light emission signals to a plurality of emission lines E1-Ek. It is to be appreciated that although one light emission driving circuit 206 is illustrated in FIG. 2, in some implementations, multiple light emission driving circuits may work in conjunction with each other.

Figure 3:
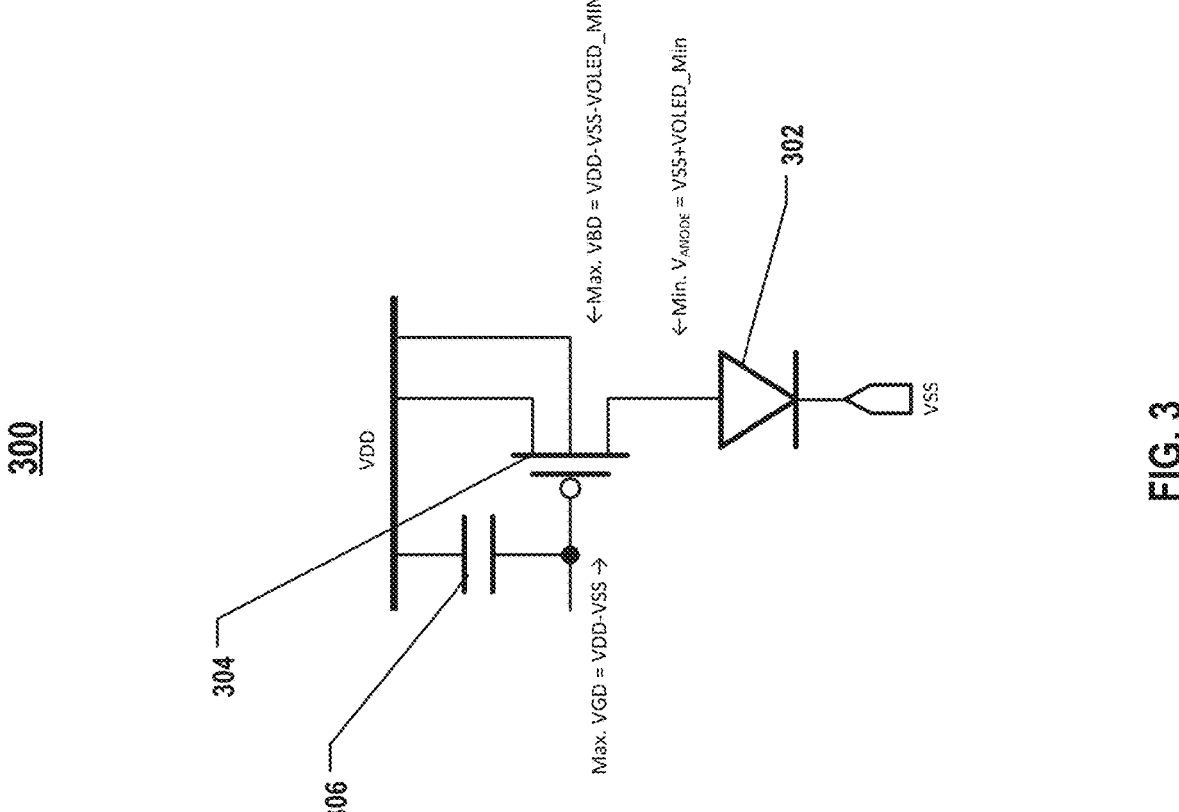
FIG. 3 illustrates a circuit diagram of a pixel driving circuit for a light emitting element, according to some aspects of the present disclosure.

FIG. 3 illustrates a circuit diagram of a pixel driving circuit 300 for a light emitting element 302, according to some aspects of the present disclosure. Light emitting element 302 may be an OLED or a micro-OLED driven by pixel driving circuit 300. Pixel driving circuit 300 includes a p-type driving transistor 304 and a capacitor 306 (e.g., a storage capacitor). In some implementations, pixel driving circuit 300 may further include switches (e.g., switching transistors or discharge control switches) or other elements. As shown in FIG. 3, the maximum of the gate-to-drain voltage (VGD) of p-type driving transistor 304 could be (VDD−VSS), the maximum of the body-to-drain voltage (VBD) of p-type driving transistor 304 could be (VDD−VSS−VOLED_Min), and the minimum voltage at the anode of light emitting element 302 could be (VSS+VOLED_Min). In some implementations, the gate-to-drain voltage (VGD) of p-type driving transistor 304 or the body-to-drain voltage (VBD) of p-type driving transistor 304 may exceed the withstand voltage of p-type driving transistor 304.

Figure 4:
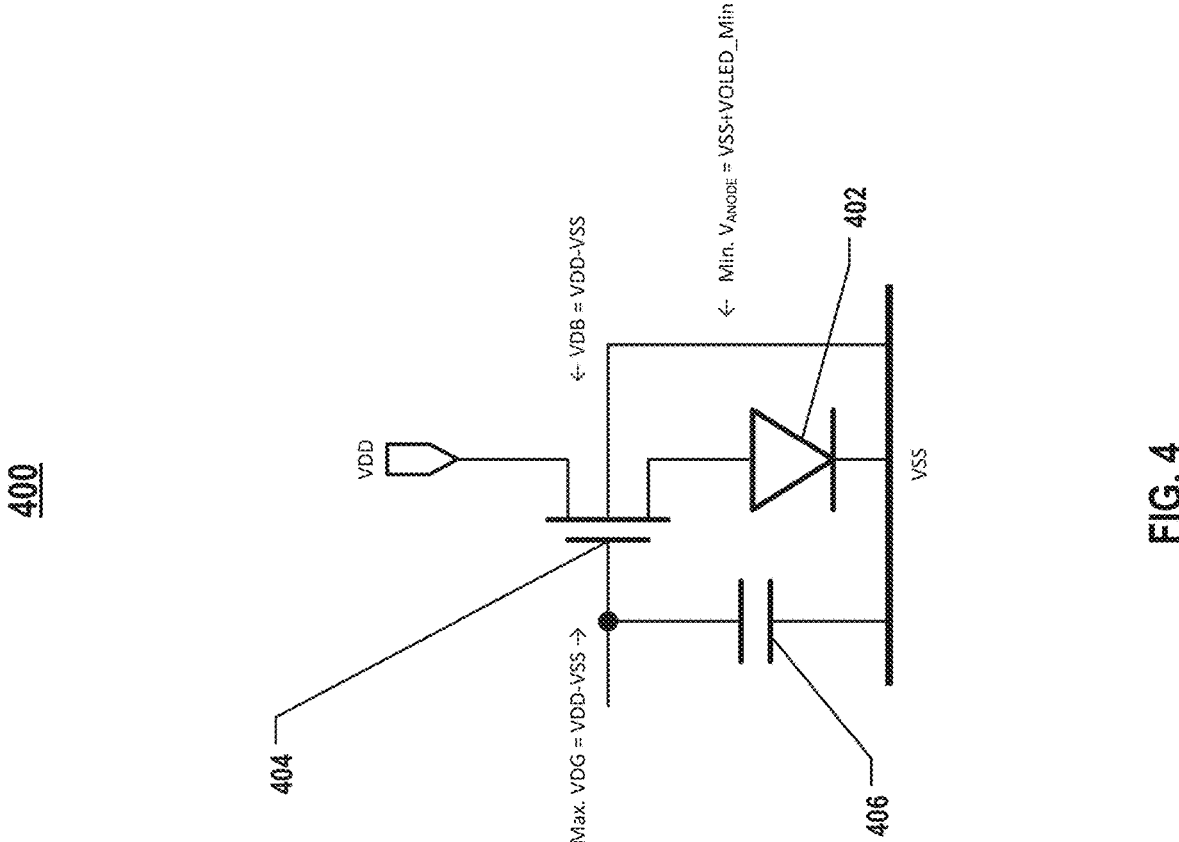
FIG. 4 illustrates a circuit diagram of a pixel driving circuit for a light emitting element, according to some aspects of the present disclosure.

FIG. 4 illustrates a circuit diagram of another pixel driving circuit 400 for a light emitting element 402, according to some aspects of the present disclosure. Light emitting element 402 may be an OLED or a micro-OLED driven by pixel driving circuit 400. Pixel driving circuit 400 includes an n-type driving transistor 404 and a capacitor 406 (e.g., a storage capacitor). In some implementations, pixel driving circuit 400 may further include switches (e.g., switching transistors or discharge control switches) or other elements. As shown in FIG. 4, the maximum of the drain-to-gate voltage (VDG) of n-type driving transistor 404 could be (VDD−VSS), the maximum of the drain-to-body voltage (VDB) of n-type driving transistor 404 could be (VDD−VSS), and the minimum voltage at the anode of light emitting element 402 could be (VSS+VOLED_Min). In some implementations, the drain-to-gate voltage (VDG) of n-type driving transistor 404 or the drain-to-body voltage (VDB) of n-type driving transistor 404 may exceed the withstand voltage of n-type driving transistor 404.

Figure 5:
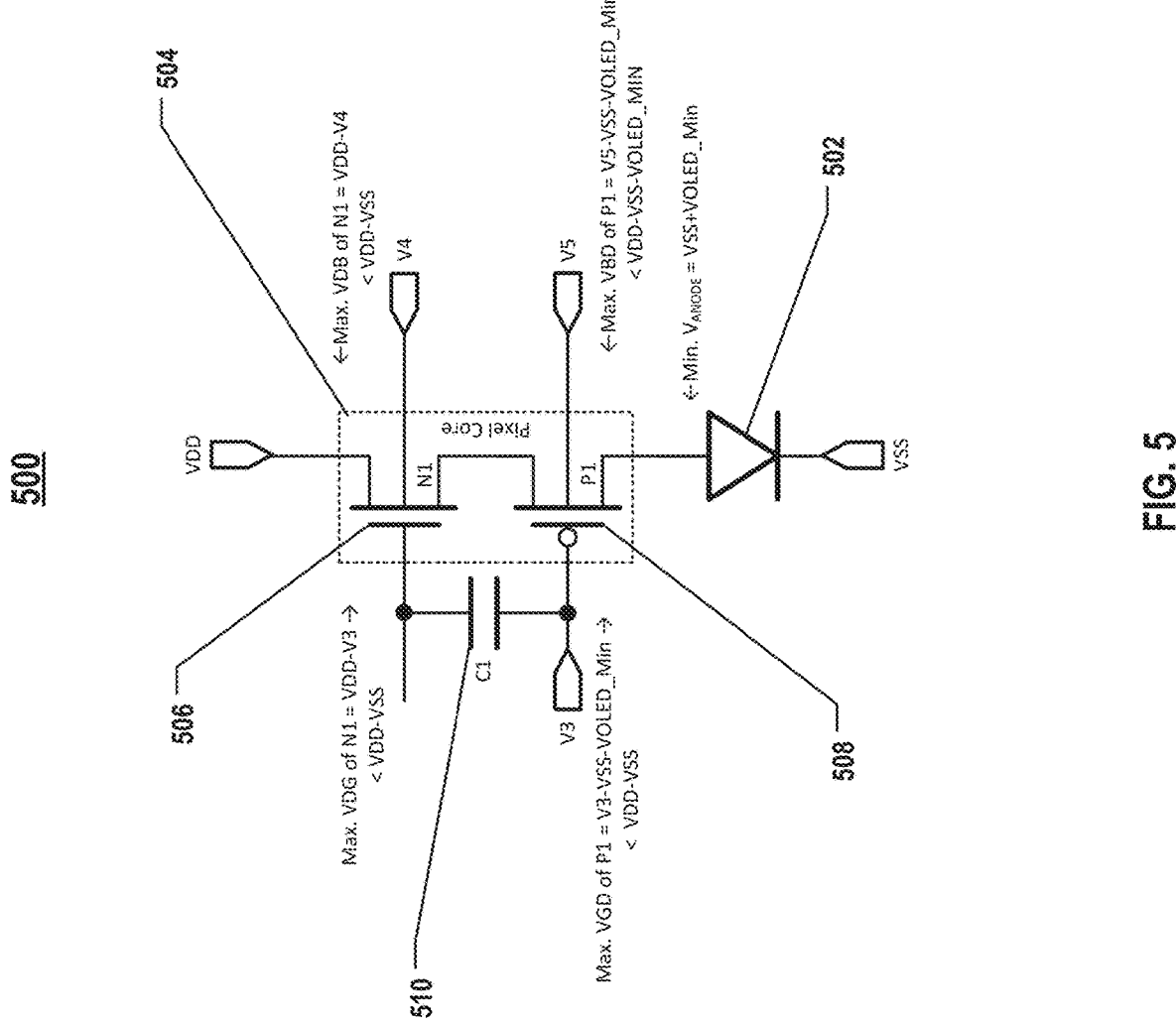
FIG. 5 illustrates a circuit diagram of a pixel driving circuit for a light emitting element, according to some aspects of the present disclosure.

FIG. 5 illustrates a circuit diagram of a pixel driving circuit 500 for a light emitting element 502, according to some aspects of the present disclosure. As shown in FIG. 5, an n-type transistor 506 is connected to a p-type transistor 508 for driving a light emitting element 502. In some implementations, n-type transistor 506 and p-type transistor 508 are collectively called a pixel core 504. A capactore 510 (C1) is coupled between the gate of n-type transistor 506 and the gate of p-type transistor 508, and a bias V3 is provided to the gate of p-type transistor 508. In some implementations, a bias V4 could be further provided to the body of n-type transistor 506, and a bias V5 could be further provided to the body of p-type transistor 508. As shown in FIG. 5, the maximum of the drain-to-gate voltage (VDG) of n-type transistor 506 could be (VDD–V3), which is smaller than (Vdd–VSS), and the maximum of the drain-to-body voltage (VDB) of n-type transistor 506 could be (VDD–V4), which is smaller than (VDD–VSS). In addition, as shown in FIG. 5, the maximum of the gate-to-drain voltage (VGD) of p-type transistor 508 could be (V3–VSS–VOLED_Min), which is smaller than (VDD–VSS), and the maximum of the body-to-drain voltage (VBD) of p-type transistor 508 could be (V5–VSS–VOLED_Min), which is smaller than (VDD–VSS–VOLED_Min). The minimum voltage at the anode of light emitting element 502 could be (VSS+VOLED_Min). With this circuit structure, the drain-to-gate voltage (VDG) of n-type transistor 506, the gate-to-drain voltage (VGD) of p-type transistor 508, the drain-to-body voltage (VDB) of n-type transistor 506, or the body-to-drain voltage (VBD) of p-type transistor 508 would be operated in a safe bias range when using a high (VDD–VSS) to drive light emitting element 502.

Figure 6A:
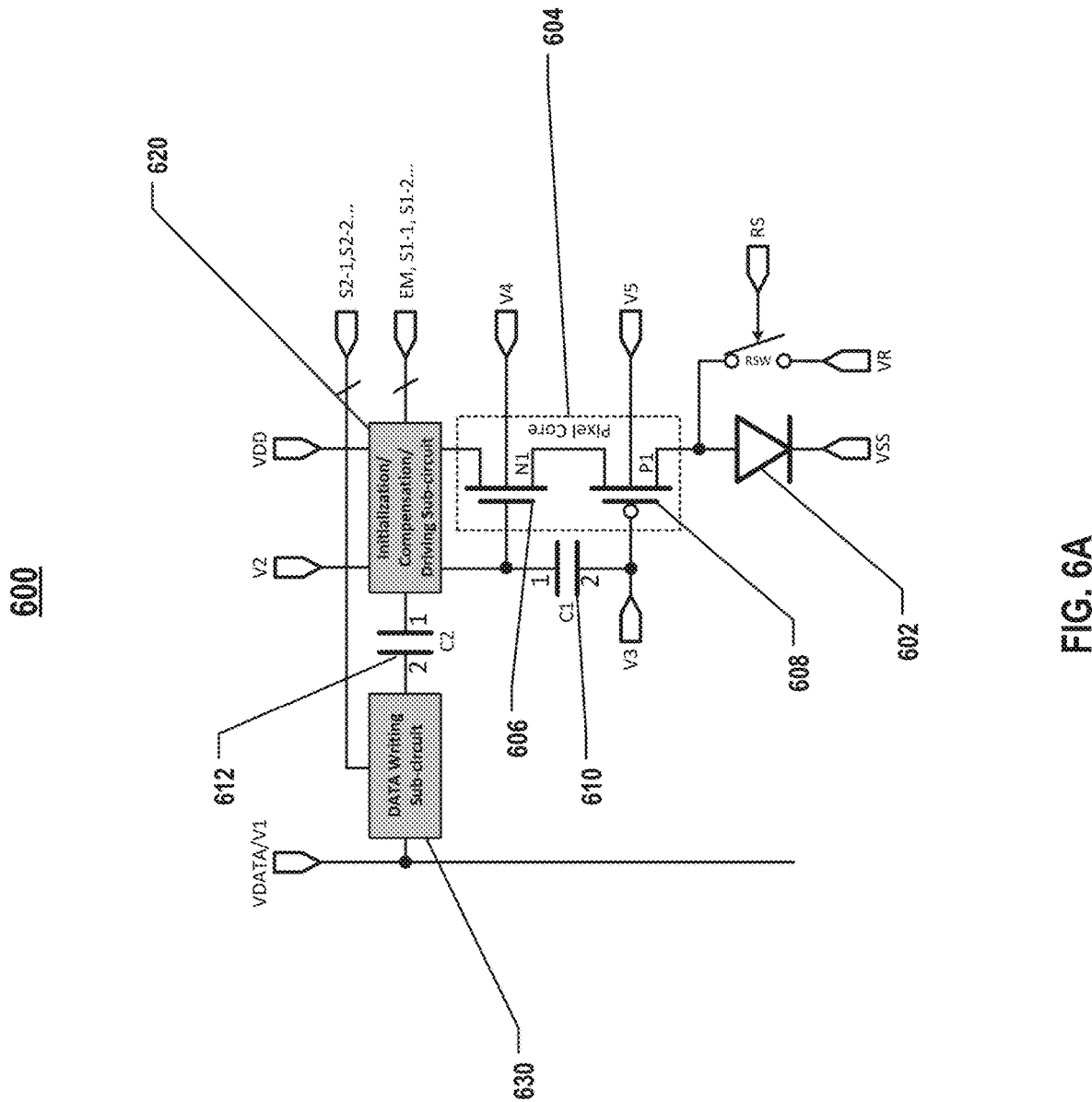
FIGS. 6A and 6B illustrate circuit diagrams of pixel driving circuits for a light emitting element, according to some aspects of the present disclosure.

FIG. 6A illustrates a circuit diagram of a pixel driving circuit 600 for a light emitting element 602, according to some aspects of the present disclosure. As shown in FIG. 6A, pixel driving circuit 600 includes a first transistor 606, a second transistor 608, and a first capacitor 610. In some implementations, first transistor 606 and second transistor 608 are different types of transistors. In some implementations, first transistor 606 is a n-type transistor, and second transistor 608 is a p-type transistor. In some implementations, first transistor 606 and second transistor 608 are collectively called pixel core 604. The first transistor 606 is configured to receive a data signal VDATA and drive light emitting element 602 based on the data signal. The first transistor 606 includes a first gate terminal, a first source terminal, and a first drain terminal. The second transistor 608 includes a second gate terminal receiving a bias signal from a bias source V3, a second source terminal coupled to the source terminal of first transistor 606, and a second drain terminal coupled to light emitting element 602. First capacitor 610 (C1) is disposed between the first gate terminal of first transistor 606 and the second gate terminal of second transistor 608.

As shown in FIG. 6A, pixel driving circuit 600 further includes a driving sub-circuit 620 and a data-writing sub-circuit 630. Driving sub-circuit 620 is coupled to the first gate terminal and the first drain terminal of first transistor 606 to selectively provide a bias signal by a bias source VDD to first transistor 606, second transistor 608, and light emitting element 602. Data-writing sub-circuit 630 is coupled to driving sub-circuit 620 to selectively provide the data signal to first transistor 606 and second transistor 608. A second capacitor 612 (C2) is disposed between driving sub-circuit 620 and data-writing sub-circuit 630.

It is understood that driving sub-circuit 620 may be an initialization/compensation/driving sub-circuit according to different operation periods. For example, in some implementations, during the initialization period P1, the function of driving sub-circuit 620 may be an initialization circuit. For another example, in some implementations, during the compensation period P2, the function of driving sub-circuit

620 may be a compensation circuit. For a further example, in some implementations, during the light emitting period P4, the function of driving sub-circuit 620 may be a light emitting driving circuit. The detailed operations of the initialization period P1, the compensation period P2, and the light emitting period P4 will be discussed below.

In some implementations, when driving the display panel with the driving circuit, the source driving circuit may provide the display data, e.g., data signal VDATA, via a plurality of source lines in frames to the plurality of sub-pixels, e.g., light emitting element 602. In some implementations, the operation of the switching of data signal VDATA may be controlled by providing the switching signals S2-1, S2-2 . . . to data-writing sub-circuit 630. Additionally, driving sub-circuit 620 may be operatively coupled to light emitting element 602 through pixel core 604 to cause each subpixel (light emitting element 602) to emit light for a certain time period in each frame by providing the switching signals EM, S1-1, S1-2 . . . to driving sub-circuit 620. In some implementations, multiple driving sub-circuit 620 may work in conjunction with each other.

In some implementations, a scan period of each display frame may include a reset period and a light emitting period, and driving sub-circuit 620 provides the bias signal VDD to pixel core 604 during the light emitting period to drive light emitting element 602. In some implementations, the reset period may include an initialization period, a compensation period, and a data writing period.

Figure 6B:
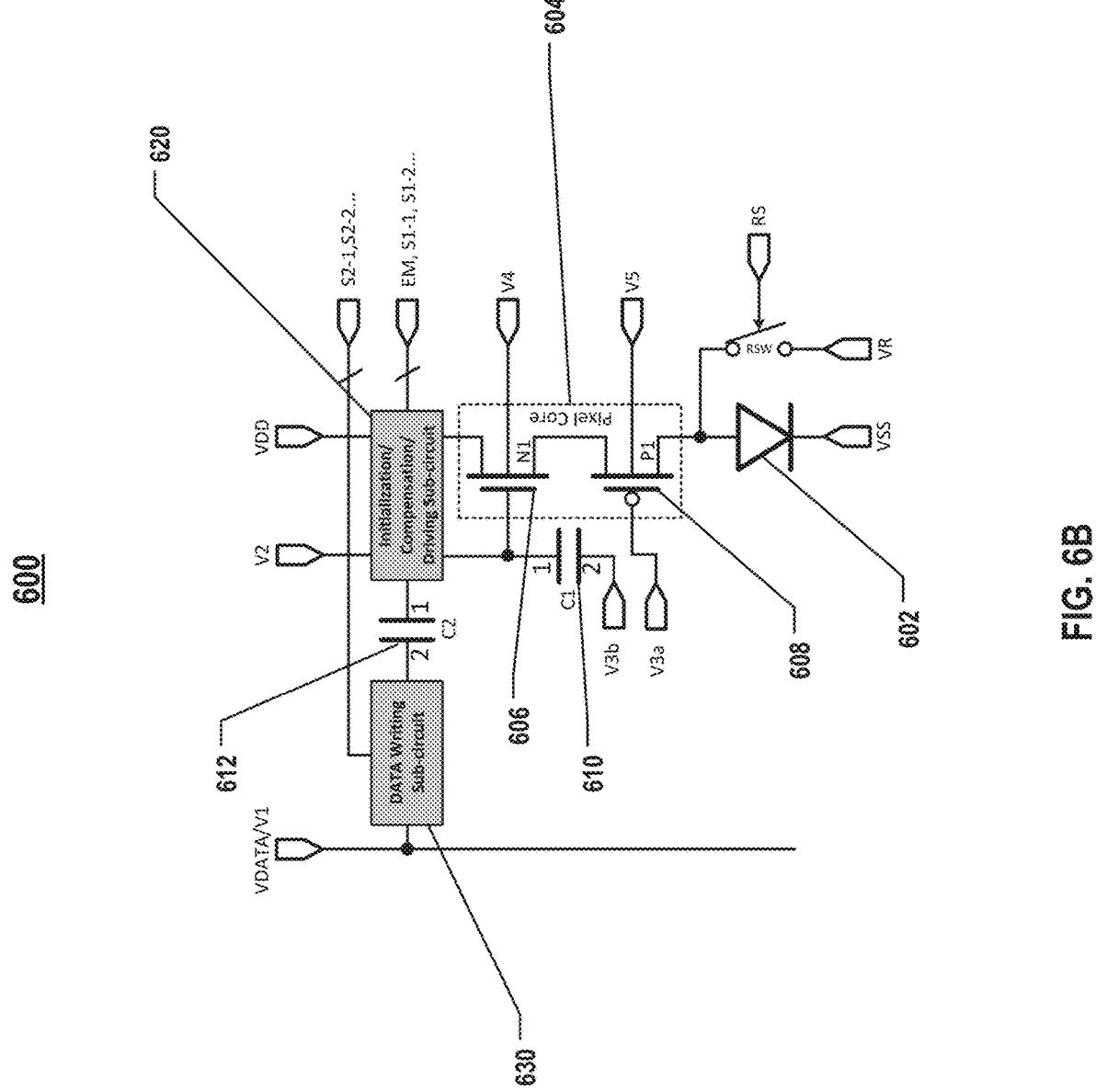

FIG. 6B illustrates another circuit diagram of pixel driving circuit 600 for light emitting element 602, according to some aspects of the present disclosure. The circuit diagram in FIG. 6B is similar to the circuit diagram in FIG. 6A, but first capacitor 610 and the gate terminal of second transistor 608 are not coupled to the same voltage source. As shown in FIG. 6B, the gate terminal of second transistor is connected to a bias source V3*a*, and an end of the first capacitor 610 is connected to a bias source V3*b*. In some implementations, bias source V3*a* and bias source V3*b* may have different voltage levels. In some implementations, bias source V3*a* and bias source V3*b* may have the same voltage level.

Figure 7:
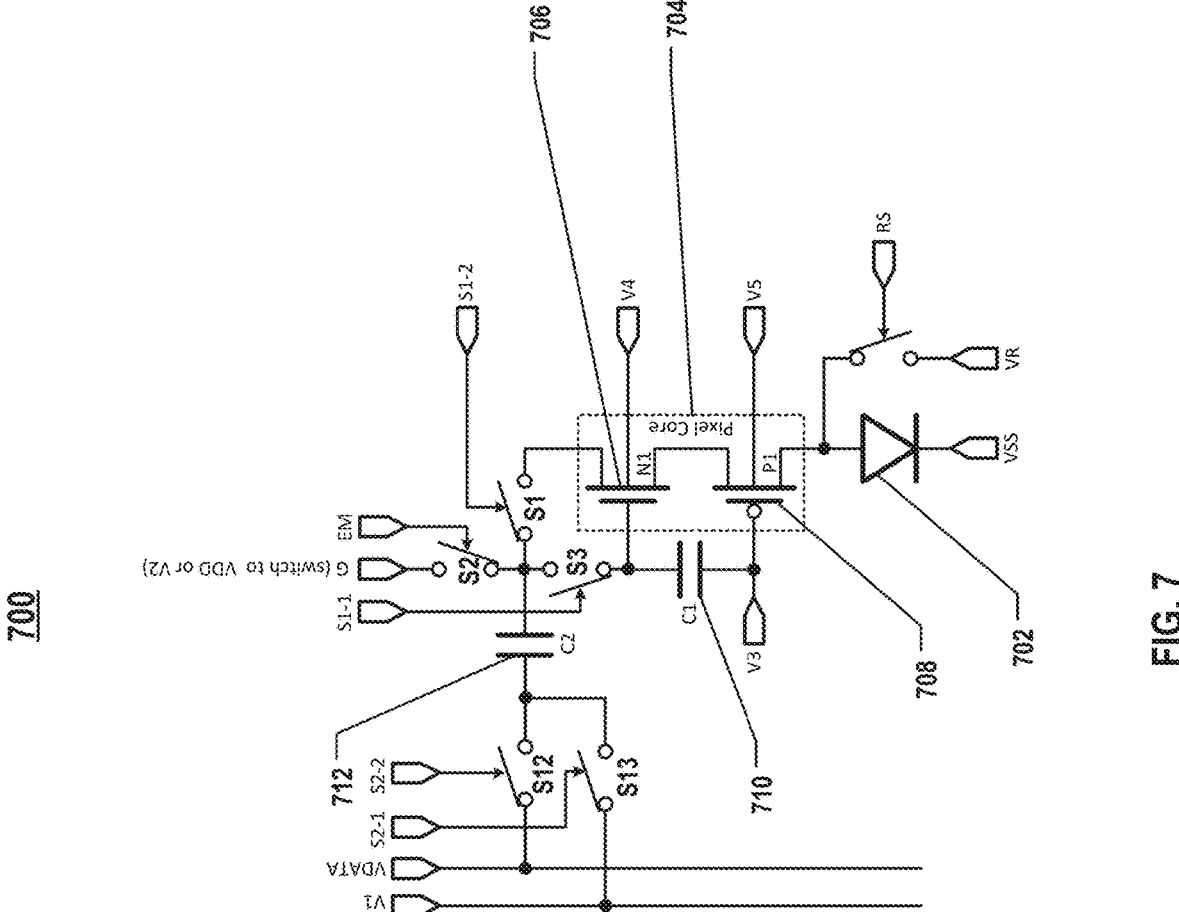
FIG. 7 illustrates a circuit diagram of a pixel driving circuit for a light emitting element, according to some aspects of the present disclosure.
Figure 8:
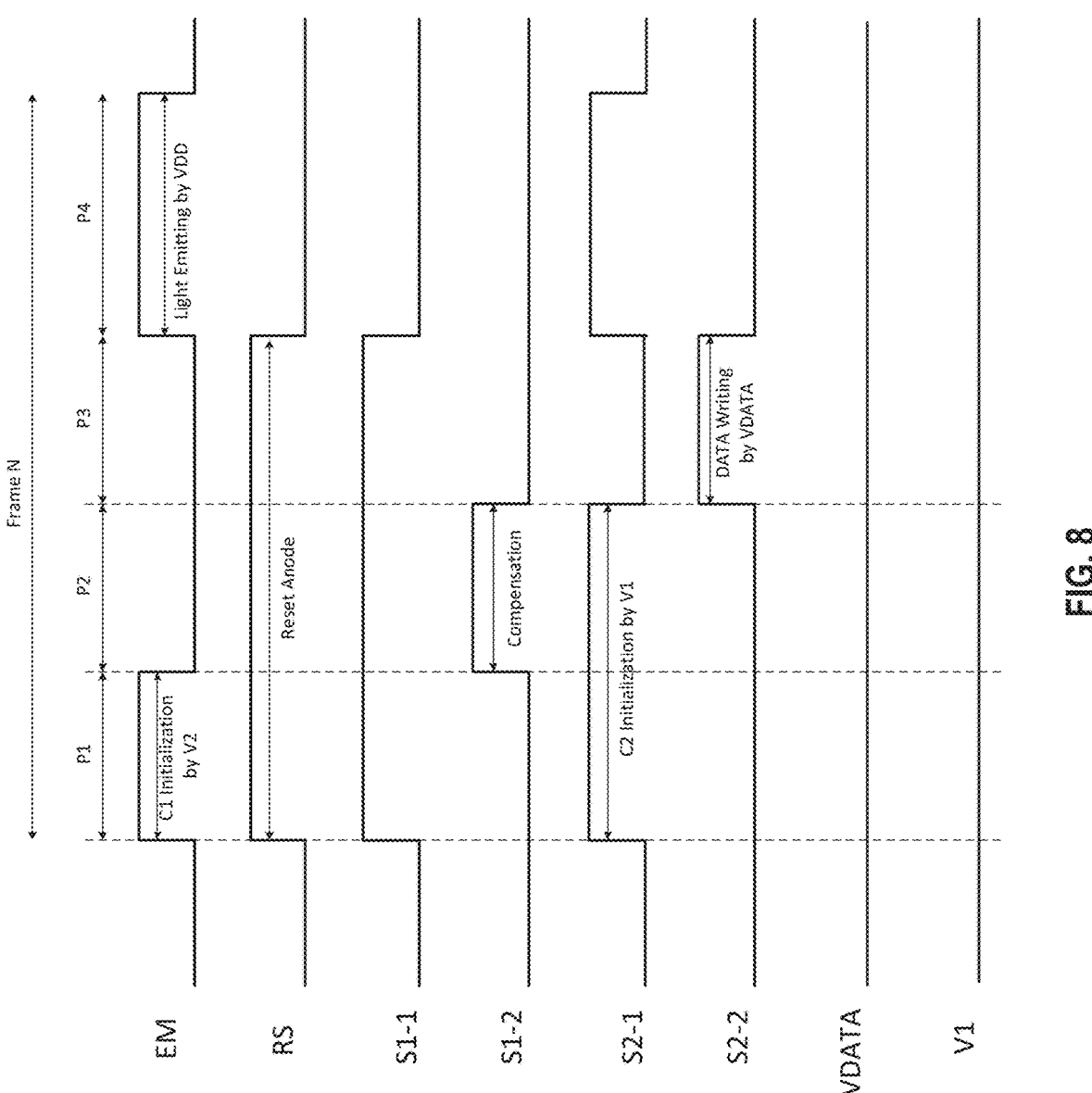
FIG. 8 illustrates a timing diagram showing the operations of the pixel driving circuit in FIG. 7, according to some aspects of the present disclosure.

FIG. 7 illustrates a circuit diagram of a pixel driving circuit 700 for a light emitting element 702, according to some aspects of the present disclosure. FIG. 8 illustrates a timing diagram showing the operations of pixel driving circuit 700 in FIG. 7, according to some aspects of the present disclosure. For the purpose of better describing the present disclosure, pixel driving circuit 700 in FIG. 7 and the timing diagram in FIG. 8 will be discussed together.

As shown in FIG. 7, pixel driving circuit 700 may include a first transistor 706, a second transistor 708, a first capacitor 710, and a second capacitor 712. In some implementations, first transistor 706 and second transistor 708 are different types of transistors. In some implementations, first transistor 706 is a n-type transistor and second transistor 708 is a p-type transistor. In some implementations, first transistor 706 and second transistor 708 are collectively called pixel core 704. The first transistor 706 includes a first gate terminal, a first source terminal, and a first drain terminal. The second transistor 708 includes a second gate terminal receiving a bias signal from a bias source V3, a second source terminal coupled to the source terminal of first transistor 706, and a second drain terminal coupled to light emitting element 702. First capacitor 710 (C1) is disposed between the first gate terminal of first transistor 706 and the second gate terminal of second transistor 708.

In addition, a switch element S1 is disposed between the first drain terminal of first transistor 706 and a first terminal of a second capacitor 712 (C2). A switch element S2 is disposed between the first terminal of second capacitor 712 and a bias source VDD/V2. A switch element S3 is disposed between the first terminal of second capacitor 712 and the first gate terminal of first transistor 706. In some implementations, driving sub-circuit 620 in FIG. 6 collectively includes switch element S1, switch element S2, and switch element S2 in FIG. 7. In some implementations, switch element S1, switch element S2, and switch element S2 may be achieved by using switching transistors or other suitable elements.

As shown in FIG. 7, a switch element S12 is disposed between a second terminal of second capacitor 712 and a data signal source providing data signal VDATA, and a switch element S13 is disposed between the second end of second capacitor 712 and a bias source V1. In some implementations, data-writing sub-circuit 630 in FIG. 6 may collectively include switch element S12 and switch element S13. In some implementations, switch element S12 and switch element S13 may be achieved by using switching transistors or other suitable elements.

As shown in FIG. 8, during an initialization period P1, a reset signal RS may connect the reset bias VR to the anode of light emitting element 702 to start the reset period, a control signal S1-1 may turn on switch element S2 to connect the first end of second capacitor 712 and the gate terminal of first transistor 706, a control signal EM may turn on switch element S2 to connect bias source G and the first end of second capacitor 712, and a control signal S2-1 may turn on switch element S13 to connect a bias source V1 and the second end of second capacitor 712. In some implementations, the bias source G may collectively provide the bias voltage V2 and the light emitting voltage VDD during different periods. In some implementations, during the initialization period P1, the first end of first capacitor 710 is initialized to a first initialization bias V2 and the first end of second capacitor 712 is initialized to a second initialization bias V1.

In some implementations, during the initialization period P1, the gate terminal of first transistor 706 may have an initial voltage. In some implementations, the initial voltage is the first initialization bias V2. In other words, (VG_N1=V2=initial voltage). In some implementations, during the initialization period P1, the voltage between two ends of first capacitor 710 may be (V2−V3). In other words, (VCAP_C1=V2−V3). In some implementations, when first capacitor 610 and the gate terminal of second transistor 608 are not coupled to the same voltage source, as shown in FIG. 6B, the voltage between two ends of first capacitor 710 may be (V2−V3b). In other words, (VCAP_C1=V2−V3b).

During a compensation period P2, the control signal EM may turn off switch element S2, and a control signal S1-2 may turn on switch element S1 In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

In some implementations, during the compensation period P2, the voltage level at the gate terminal of first transistor 706 may equal the sum of the threshold voltage of first transistor 706, the threshold voltage of second transistor

708, and voltage V3. In other words, (VG_N1=VTH_N1+VTH_P1+V3). In some implementations, when first capacitor 610 and the gate terminal of the second transistor 608 are not coupled to the same voltage source, as shown in FIG. 613, (VG_N1=VTH_N1+VTH_P1+V3a). In some implementations, during the compensation period P2, the voltage difference between the two ends of first capacitor 710 may be the sum of the threshold voltage of first transistor 706 and the threshold voltage of second transistor 708. In other words, (VCAP_C1=VTH_N1+VTH_P1). In some implementations, when first capacitor 610 and the gate terminal of second transistor 608 are not coupled to the same voltage source, as shown in FIG. 6B, the voltage difference between two ends of first capacitor 710 is (VCAP_C1=VTH_N1+VTH_P1+(V3a−V3b)).

During a data writing period P3, control signal S1-2 may turn off switch element S1, control signal S2-1 may turn off switch element S13, and a control signal S2-2 may turn on switch element S12. In some implementations, during the data writing period P3, the data signal VDATA is provided to the second end of second capacitor 712.

In some implementations, during the writing period P3, the voltage difference between two ends of first capacitor 710 may be the sum of the threshold voltage of first transistor 706, the threshold voltage of second transistor 708, and a partial voltage at the second end of second capacitor 712 divided by first capacitor 710 and second capacitor 712. In other words, the voltage difference between two ends of first capacitor 710 is $(VCAP\_C1=VTH\_N1+VTH\_P1+\Delta V\_2^{nd}end\_C2*C2/(C1+C2))$. In some implementations, when first capacitor 610 and the gate terminal of second transistor 608 are not coupled to the same voltage source, as shown in FIG. 6B, the voltage difference between the two ends of first capacitor 710 is $(VCAP\_C1=VTH\_N1+VTH\_P1+(V3a-V3b)+\Delta V\_2^{nd}end\_C2*(C2/(C1+C2)))$.

During a light emitting period P4, the reset signal RS may disconnect the reset bias VR from the anode of light emitting element 702 to start the light emitting period, the control signal EM may turn on switch element S2 again to provide the emitting voltage VDD, the control signal S1-1 may turn off switch element S2, and the control signal S2-2 may turn off switch element S12. In some implementations, during the light emitting period P4, the emitting voltage VDD may drive light emitting element 702 to emit based on the data signal VDATA.

In some implementations, during the emitting period P4, the current $I_{EM}$ for emitting light emitting element 702 is $(\frac{1}{2}*\mu n*Cox*W\_N1/L\_N1*(VGS\_N1-VTH\_N1)^2)$ or $(\frac{1}{2}*\mu p*Cox*W\_P1/L\_P1*(VSG\_P1-VTH\_P1)^2)$. Here, W/L is the aspect ratio of first transistor 606 or second transistor 608, μ is a channel carrier mobility, and Cox is the capacitance of a channel insulation layer of first transistor 606 or second transistor 608. In some implementations, the gate-to-source voltage (VGS) of first transistor 606 is $VGS\_N1=[\alpha*\Delta V\_2^{nd}\ end\_C2*C2/(C1+C2)]+VTH\_N1$, and the gate-to-source voltage (VGS) of second transistor 608 is $VGS\_P1=[\beta*\Delta V\_2^{nd}end\_C2*C2/(C1+C2)]+VTH\_P1$, wherein α+β=1.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD−VSS) to drive light emitting element 702.

Figure 9:
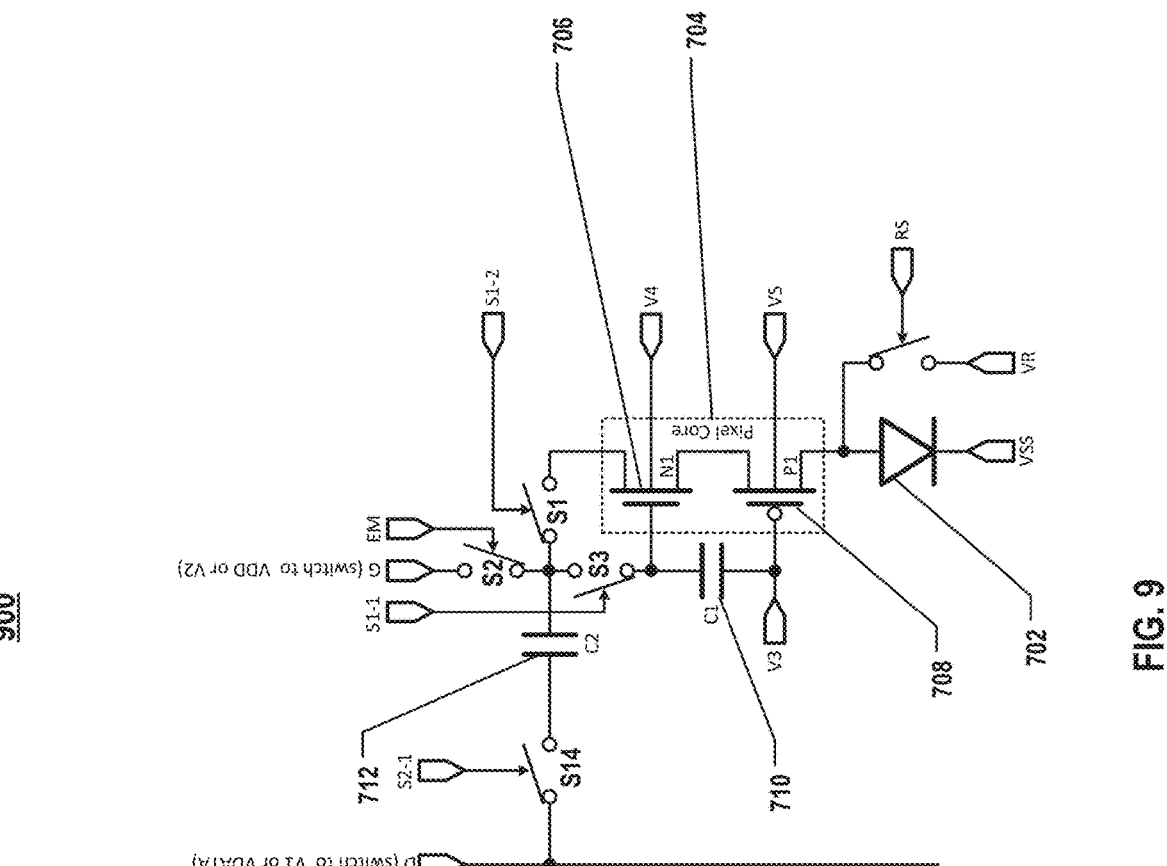
FIG. 9 illustrates a circuit diagram of a pixel driving circuit for a light emitting element, according to some aspects of the present disclosure.
Figure 10:
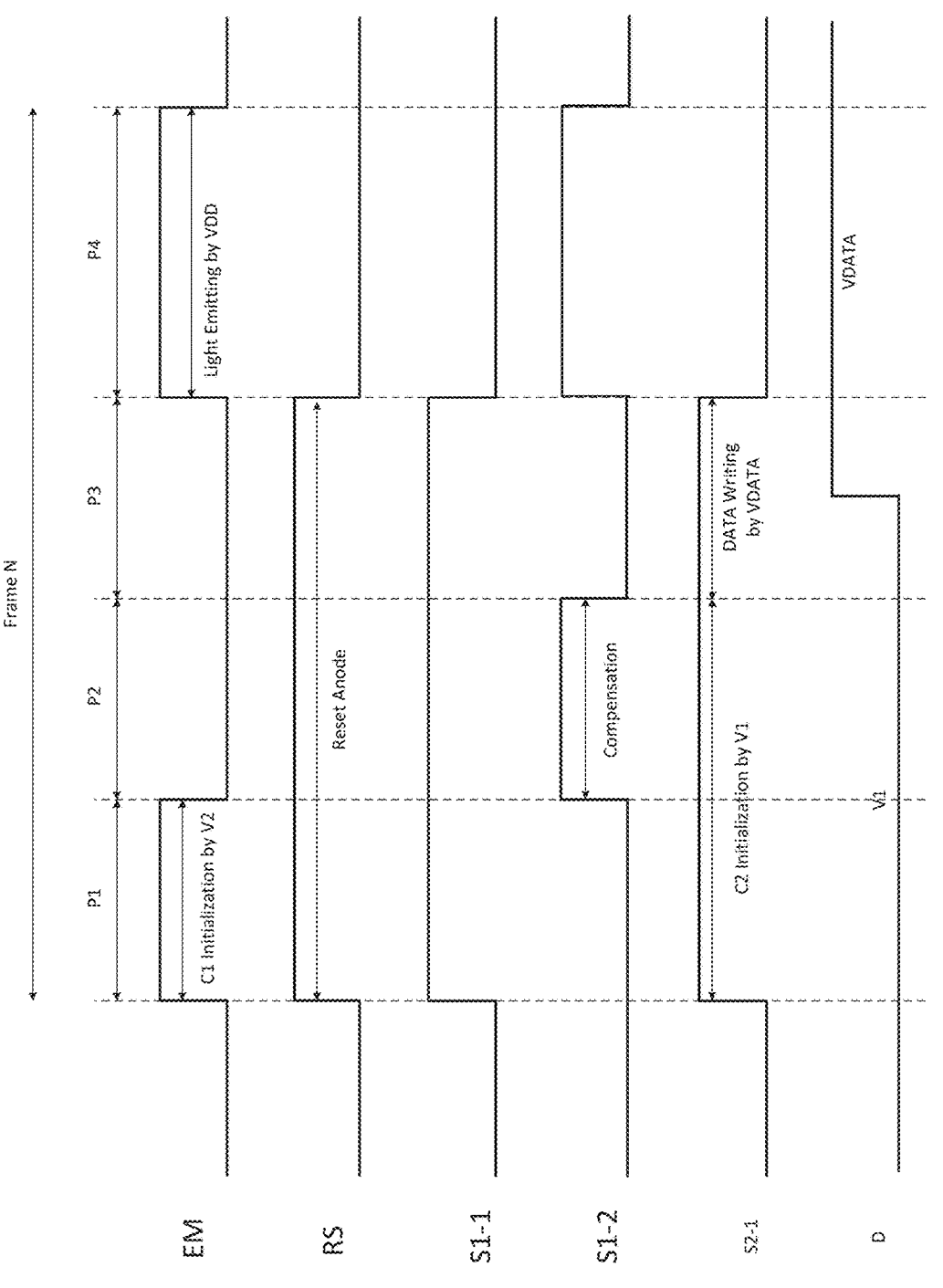
FIG. 10 illustrates a timing diagram showing the operations of the pixel driving circuit in FIG. 9, according to some aspects of the present disclosure.

FIG. 9 illustrates a circuit diagram of another pixel driving circuit 900 for a light emitting element 702, according to some aspects of the present disclosure. FIG. 10 illustrates a timing diagram showing the operations of pixel driving circuit 900 in FIG. 9, according to some aspects of the present disclosure. For the purpose of better describing the present disclosure, pixel driving circuit 900 in FIG. 9 and the timing diagram in FIG. 10 will be discussed together.

As shown in FIG. 9, driving sub-circuit 620 in FIG. 6 collectively includes switch element S1, switch element S2, and switch element S3 in FIG. 9, and is similar to the circuit structure in FIG. 7. Data-writing sub-circuit 630 in FIG. 6 may include a switch element S14 in FIG. 9. The switch element S14 is disposed between the second end of second capacitor 712 and a bias source D. In some implementations, the bias source D may provide the bias voltage V1 and the data signal VDATA during different periods.

As shown in FIG. 10, during the initialization period P1, the reset signal RS may connect the reset bias VR to the anode of light emitting element 702 to start the reset period, the control signal S1-1 may turn on switch element S2 to connect the first end of second capacitor 712 and the gate terminal of first transistor 706, the control signal EM may turn on switch element S2 to connect bias source G and the first end of second capacitor 712, and the control signal S2-1 may turn on switch element S14 to connect the bias source V1 and the second end of second capacitor 712. In some implementations, the bias source G may collectively provide the bias voltage V2 and the light emitting voltage VDD during different periods. In some implementations, during the initialization period P1, the first end of first capacitor 710 is initialized to the first initialization bias V2, and the first end of second capacitor 712 is initialized to a second initialization bias V1.

During the compensation period P2, the control signal EM may turn off switch element S2, and the control signal S1-2 may turn on switch element S1. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During the data writing period P3, control signal S1-2 may turn off switch element S1. The control signal S2-1 may keep turning on switch element S14, and the bias source D may be changed to provide the data signal VDATA instead of providing the bias voltage V1.

During the light emitting period P4, the reset signal RS may disconnect the reset bias VR from the anode of light emitting element 702 to start the light emitting period, the control signal EM may turn on switch element S2 again to provide the emitting voltage VDD, the control signal S1-1 may turn off switch element S2, and the control signal S2-1 may turn off switch element S14. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 11:
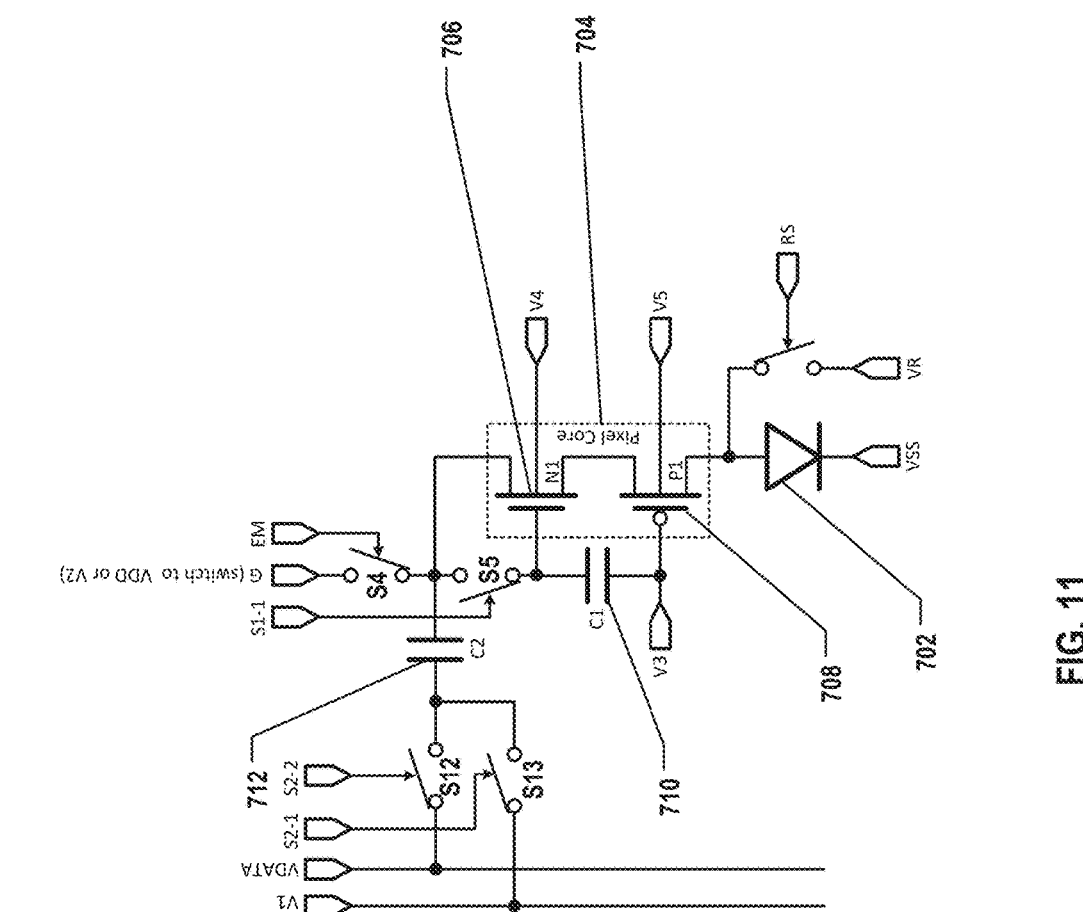
FIG. 11 illustrates a circuit diagram of a pixel driving circuit for a light emitting element, according to some aspects of the present disclosure.
Figure 12:
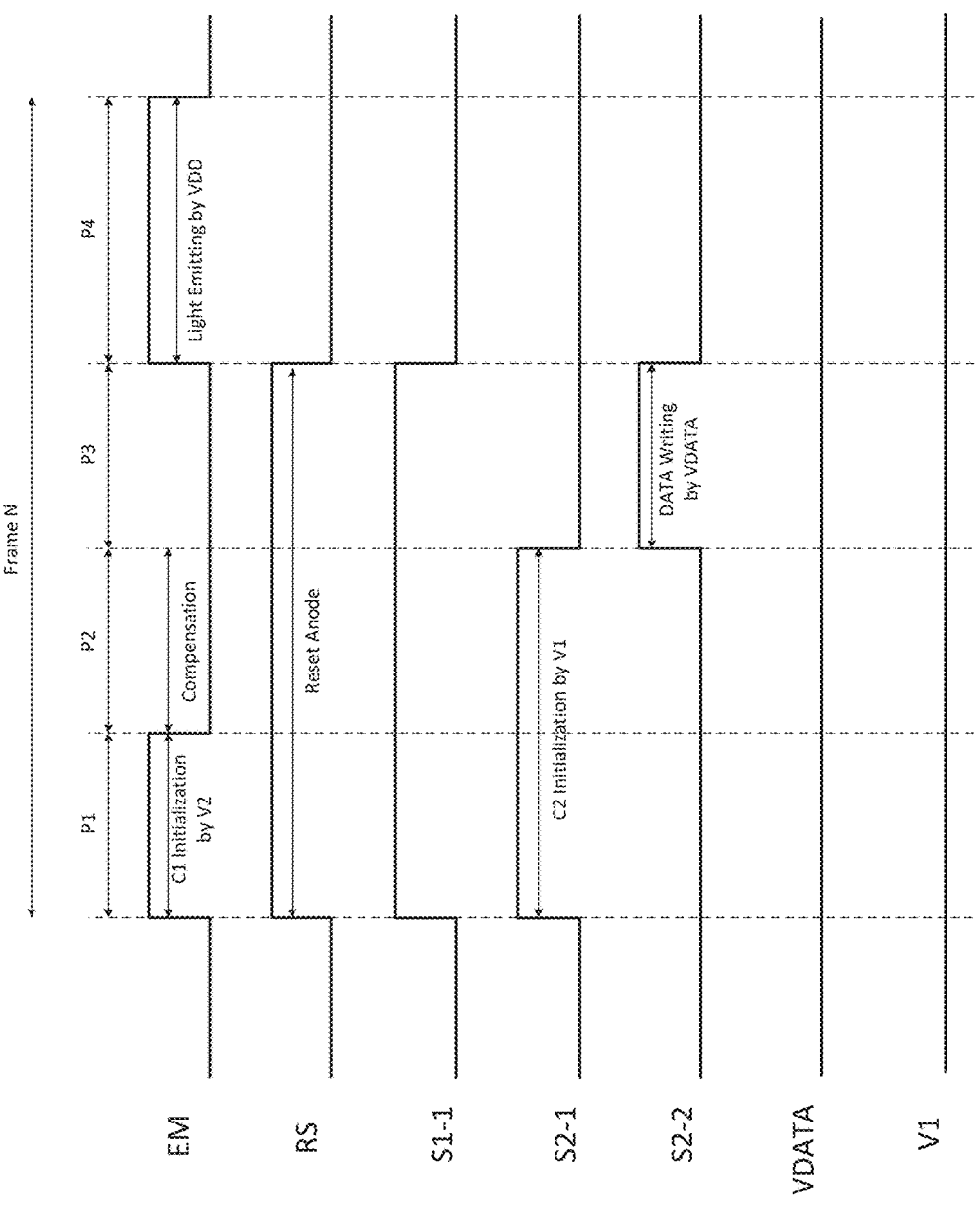
FIG. 12 illustrates a timing diagram showing the operations of the pixel driving circuit in FIG. 11, according to some aspects of the present disclosure.

FIG. 11 illustrates a circuit diagram of another pixel driving circuit 1100 for a light emitting element 702, according to some aspects of the present disclosure. FIG. 12 illustrates a timing diagram showing the operations of pixel driving circuit 1100 in FIG. 11, according to some aspects of the present disclosure. For the purpose of better describing the present disclosure, pixel driving circuit 1100 in FIG. 11 and the timing diagram in FIG. 12 will be discussed together.

As shown in FIG. 11, a switch element S4 is disposed between the bias source G and the first end of second capacitor 712, and a switch element S5 is disposed between the first end of second capacitor 712 and the gate of first transistor 706. In some implementations, driving sub-circuit 620 in FIG. 6 collectively includes switch element S4 and switch element S5 in FIG. 1. In some implementations, switch element S4 and switch element S5 may be achieved by using switching transistors or other suitable elements.

As shown in FIG. 11, switch element S12 is disposed between the second end of second capacitor 712 and the data signal source providing data signal VDATA, and switch element S13 is disposed between the second end of second capacitor 712 and the bias source V1. In some implementations, data-writing sub-circuit 630 in FIG. 6 may collectively include switch element S12 and switch element S13. In some implementations, switch element S12 and switch element S13 may be achieved by using switching transistors or other suitable elements. In some implementations, the structure and operation of switch element S12 and switch element S13 in FIG. 11 may be similar to switch element S12 and switch element S13 in FIG. 7.

As shown in FIG. 12, during the initialization period P1, the reset signal RS may connect the reset bias VR to the anode of light emitting element 702 to start the reset period, the control signal S1-1 may turn on switch element S5 to connect the first end of second capacitor 712 and the gate terminal of first transistor 706, and the control signal EM may turn on switch element S4 to connect bias source G and the first end of second capacitor 712. In some implementations, the bias source G may collectively provide the bias voltage V2 and the light emitting voltage VDD during different periods. In some implementations, during the initialization period P1, the first end of first capacitor 710 is initialized to a first initialization bias V2, and the second end of second capacitor 712 is initialized to second initialization bias V1.

During the compensation period P2, the control signal EM may turn off switch element S4. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During the data writing period P3, control signal S2-1 may turn off switch element S13, and control signal S2-2 may turn on switch element S12. In some implementations, during the data writing period P3, the data signal VDATA is provided to the second end of second capacitor 712.

During the light emitting period P4, the reset signal RS may disconnect the reset bias VR from the anode of light emitting element 702 to start the light emitting period, the control signal EM may turn on switch element S4 again to provide the emitting voltage VDD, the control signal S1-1 may turn off switch element S5, and the control signal S2-2 may turn off switch element S12. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 13:
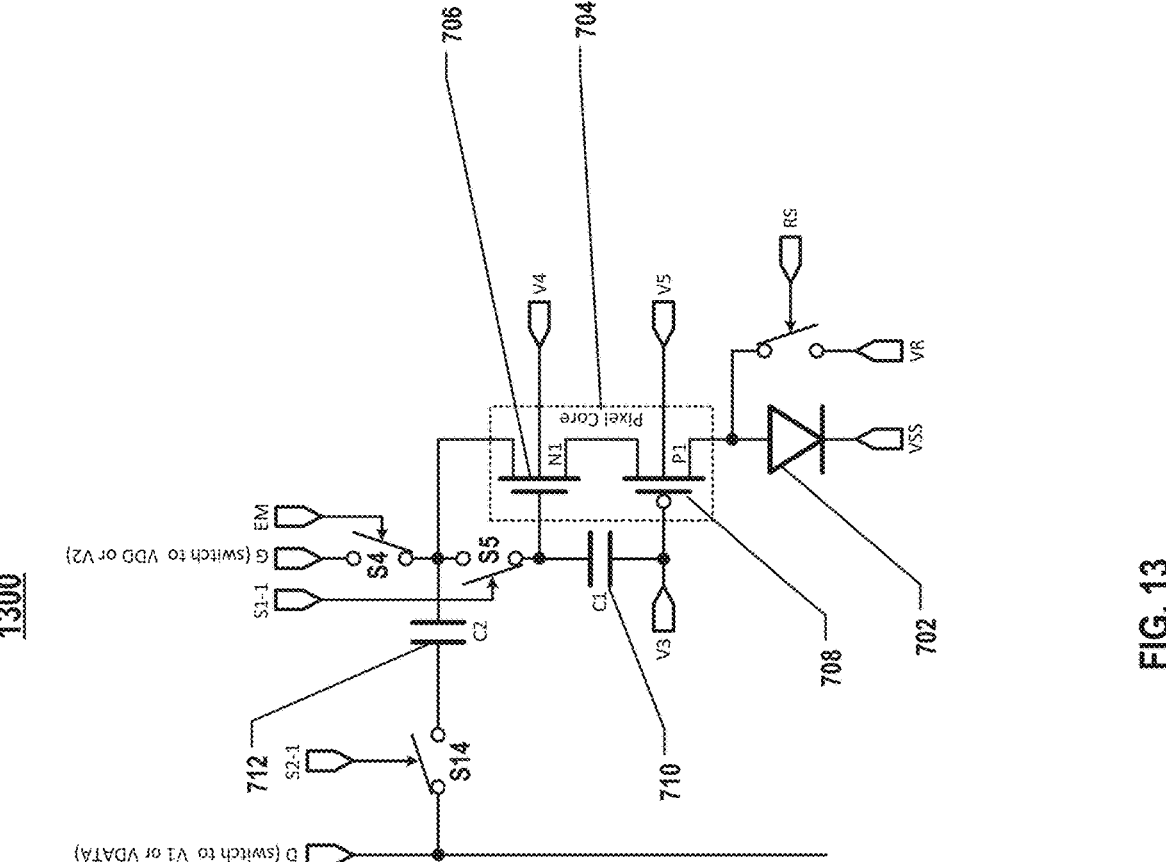
FIG. 13 illustrates a circuit diagram of a pixel driving circuit for a light emitting element, according to some aspects of the present disclosure.
Figure 14:
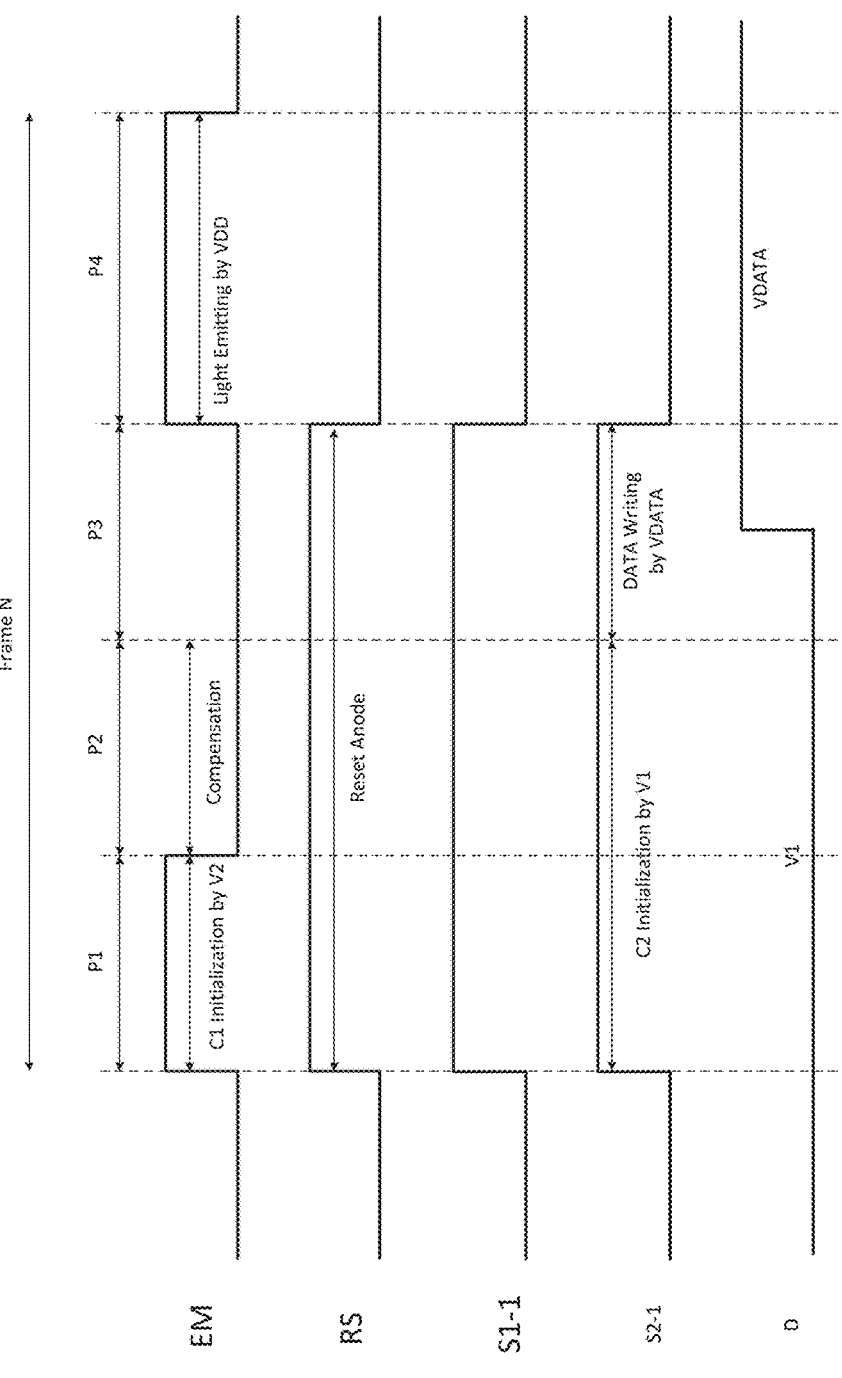
FIG. 14 illustrates a timing diagram showing the operations of the pixel driving circuit in FIG. 13, according to some aspects of the present disclosure.

FIG. 13 illustrates a circuit diagram of another pixel driving circuit 1300 for a light emitting element 702, according to some aspects of the present disclosure. FIG. 14 illustrates a timing diagram showing the operations of pixel driving circuit 1300 in FIG. 13, according to some aspects of the present disclosure. For the purpose of better describing the present disclosure, pixel driving circuit 1300 in FIG. 13 and the timing diagram in FIG. 14 will be discussed together.

As shown in FIG. 13, driving sub-circuit 620 in FIG. 6 collectively includes switch element S4 and switch element S5 in FIG. 13, and is similar to the circuit structure in FIG. 11. Data-writing sub-circuit 630 in FIG. 6 may include a switch element S14 in FIG. 13, and is similar to switch element S14 in FIG. 9.

As shown in FIG. 14, during the initialization period P1, the reset signal RS may connect the reset bias VR to the anode of light emitting element 702 to start the reset period, the control signal S1-1 may turn on switch element S5 to connect the first end of second capacitor 712 and the gate terminal of first transistor 706, and the control signal EM may turn on switch element S4 to connect bias source G and the first end of second capacitor 712. In some implementations, the bias source G may collectively provide the bias voltage V2 and the light emitting voltage VDD during different periods. In some implementations, during the initialization period P1, the first end of first capacitor 710 is initialized to a first initialization bias V2, and the second end of second capacitor 712 is initialized to second initialization bias V1.

During the compensation period P2, the control signal EM may turn off switch element S4. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During the data writing period P3, the control signal S2-1 may keep turning on switch element S14, and the bias source D may be changed to provide the data signal VDATA instead of providing the bias voltage V1.

During the light emitting period P4, the reset signal RS may disconnect the reset bias VR from the anode of light emitting element 702 to start the light emitting period, the control signal EM may turn on switch element S4 again to provide the emitting voltage VDD, the control signal S1-1 may turn off switch element S5, and the control signal S2-1 may turn off switch element S14. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 15:
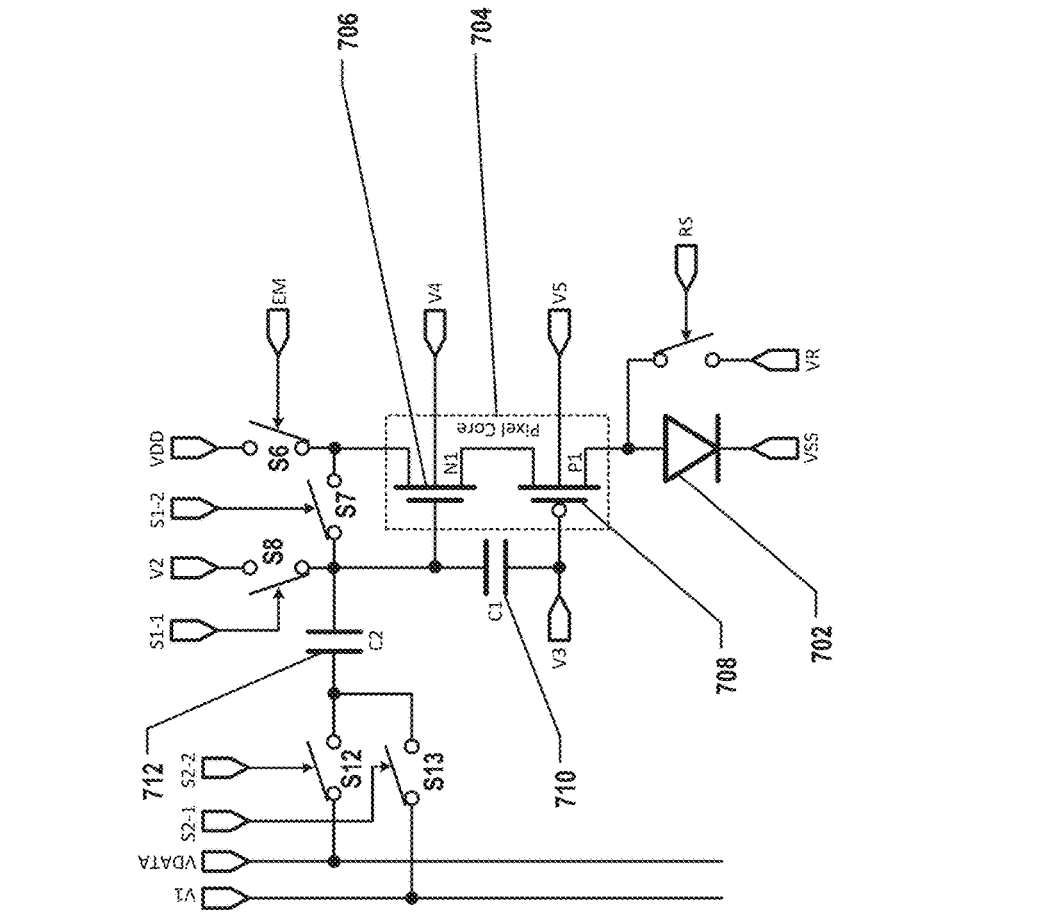
FIG. 15 illustrates a circuit diagram of a pixel driving circuit for a light emitting element, according to some aspects of the present disclosure.
Figure 16:
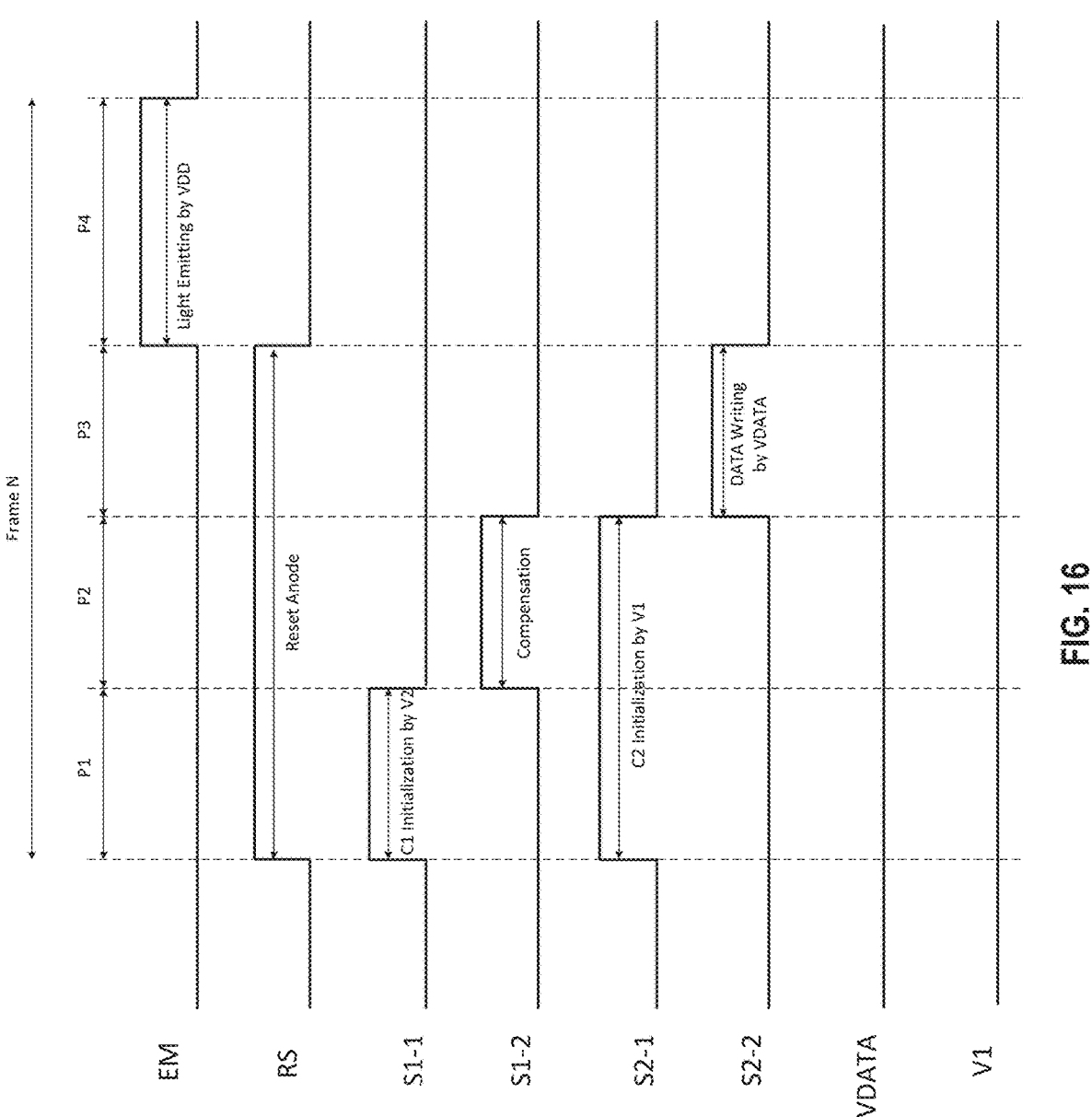
FIG. 16 illustrates a timing diagram showing the operations of the pixel driving circuit in FIG. 15, according to some aspects of the present disclosure.

FIG. 15 illustrates a circuit diagram of another pixel driving circuit 1500 for a light emitting element 702, according to some aspects of the present disclosure. FIG. 16 illustrates a timing diagram showing the operations of pixel driving circuit 1500 in FIG. 15, according to some aspects of the present disclosure. For the purpose of better describing the present disclosure, pixel driving circuit 1500 in FIG. 15 and the timing diagram in FIG. 16 will be discussed together.

As shown in FIG. 15, a switch element S6 is disposed between a bias source VDD and the first drain terminal of first transistor 706, a switch element S7 is disposed between the first drain terminal of first transistor 706 and a first end of the second capacitor 712, and a switch element S8 is disposed between the first end of second capacitor 712 and a bias source V2. In some implementations, driving sub-circuit 620 in FIG. 6 collectively includes switch element S6, switch element S7, and switch element S8 in FIG. 15. In some implementations, switch element S6, switch element S7, and switch element S8 may be achieved by using switching transistors or other suitable elements.

As shown in FIG. 15, switch element S12 is disposed between a second end of second capacitor 712 and a data signal source providing data signal VDATA, and switch element S13 is disposed between the second end of second capacitor 712 and a bias source V1 In some implementations, data-writing sub-circuit 630 in FIG. 6 may collectively include switch element S12 and switch element S13. In some implementations, switch element S12 and switch element S13 may be achieved by using switching transistors or other suitable elements.

As shown in FIG. 16, during the initialization period P1, the reset signal RS may connect the reset bias VR to the anode of light emitting element 702 to start the reset period, the control signal S1-1 may turn on switch element S8 to connect the bias source V2 with the first end of second capacitor 712 and the gate terminal of first transistor 706. The control signal S2-1 may turn on switch element S13 to connect a bias source V1 and the second end of second capacitor 712. In some implementations, during the initialization period P1, the first end of first capacitor 710 is initialized to a first initialization bias V2, and the first end of second capacitor 712 is initialized to a second initialization bias V1.

During the compensation period P2, the control signal S1-1 may turn off switch element S8, and the control signal S1-2 may turn on switch element S7. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During a data writing period P3, the control signal S1-2 may turn off switch element S7, the control signal S2-1 may turn off switch element S13 to disconnect the bias source V1 and the second end of second capacitor 712, and the control signal S2-2 may turn on switch element S12. In some implementations, during the data writing period P3, the data signal VDATA is provided to the second end of second capacitor 712.

During the light emitting period P4, the reset signal RS may disconnect the reset bias VR from the anode of light emitting element 702 to start the light emitting period, the control signal EM may turn on switch element S6 to provide the emitting voltage VDD, and the control signal S2-2 may turn off switch element S12. In some implementations, during the light emitting period P1, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 17:
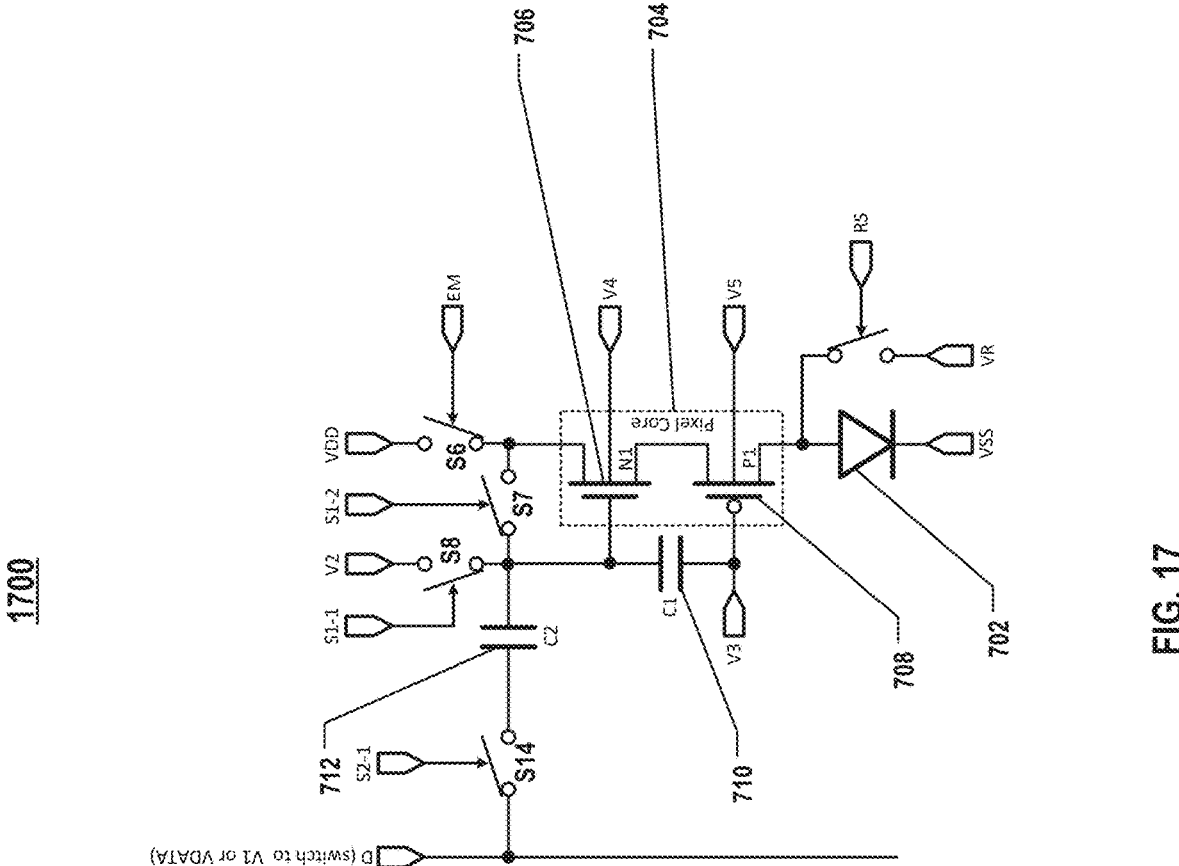
FIG. 17 illustrates a circuit diagram of a pixel driving circuit for a light emitting element, according to some aspects of the present disclosure.
Figure 18:
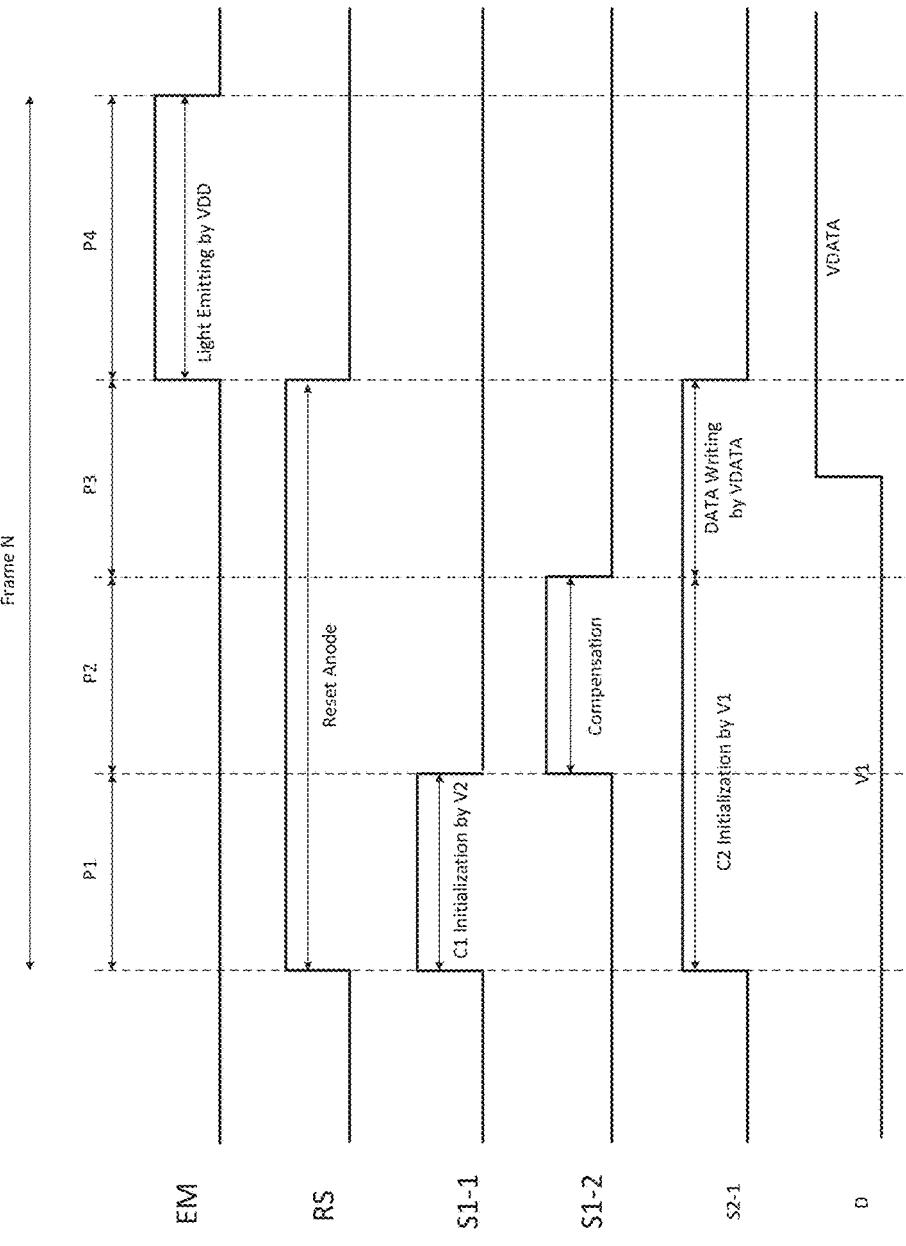
FIG. 18 illustrates a timing diagram showing the operations of the pixel driving circuit in FIG. 17, according to some aspects of the present disclosure.

FIG. 17 illustrates a circuit diagram of another pixel driving circuit 1700 for a light emitting element 702, according to some aspects of the present disclosure. FIG. 18 illustrates a timing diagram showing the operations of pixel driving circuit 1700 in FIG. 17, according to some aspects of the present disclosure. For the purpose of better describing the present disclosure, pixel driving circuit 1700 in FIG. 17 and the timing diagram in FIG. 18 will be discussed together.

As shown in FIG. 17, driving sub-circuit 620 in FIG. 6 collectively includes switch element S6, switch element S7, and switch element S8 in FIG. 17, and is similar to the circuit structure in FIG. 15. Data-writing sub-circuit 630 in FIG. 6 may include the switch element S14 in FIG. 17, and is similar to switch element S14 in FIG. 9.

As shown in FIG. 18, during the initialization period P1, the reset signal RS may connect the reset bias VR to the anode of light emitting element 702 to start the reset period, the control signal S1-1 may turn on switch element S8 to connect the bias source V2 with the first end of second capacitor 712 and the gate terminal of first transistor 706. The control signal S2-1 may turn on switch element S14 to connect a bias source D and the second end of second capacitor 712. In some implementations, during the initialization period P1, the first end of first capacitor 710 is initialized to a first initialization bias V2, and the first end of second capacitor 712 is initialized to a second initialization bias V1.

During the compensation period P2, the control signal S1-1 may turn off switch element S8, and the control signal S1-2 may turn on switch element S7. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During a data writing period P3, the control signal S1-2 may turn off switch element S7, and the control signal S2-1 may keep turning on the switch element S14. The bias source D is changed from proving the bias V1 to providing data signal VDATA.

During the light emitting period P4, the reset signal RS may disconnect the reset bias VR from the anode of light emitting element 702 to start the light emitting period, the control signal EM may turn on switch element S6 to provide the emitting voltage VDD, and the control signal S2-1 may turn off switch element S14. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 19:
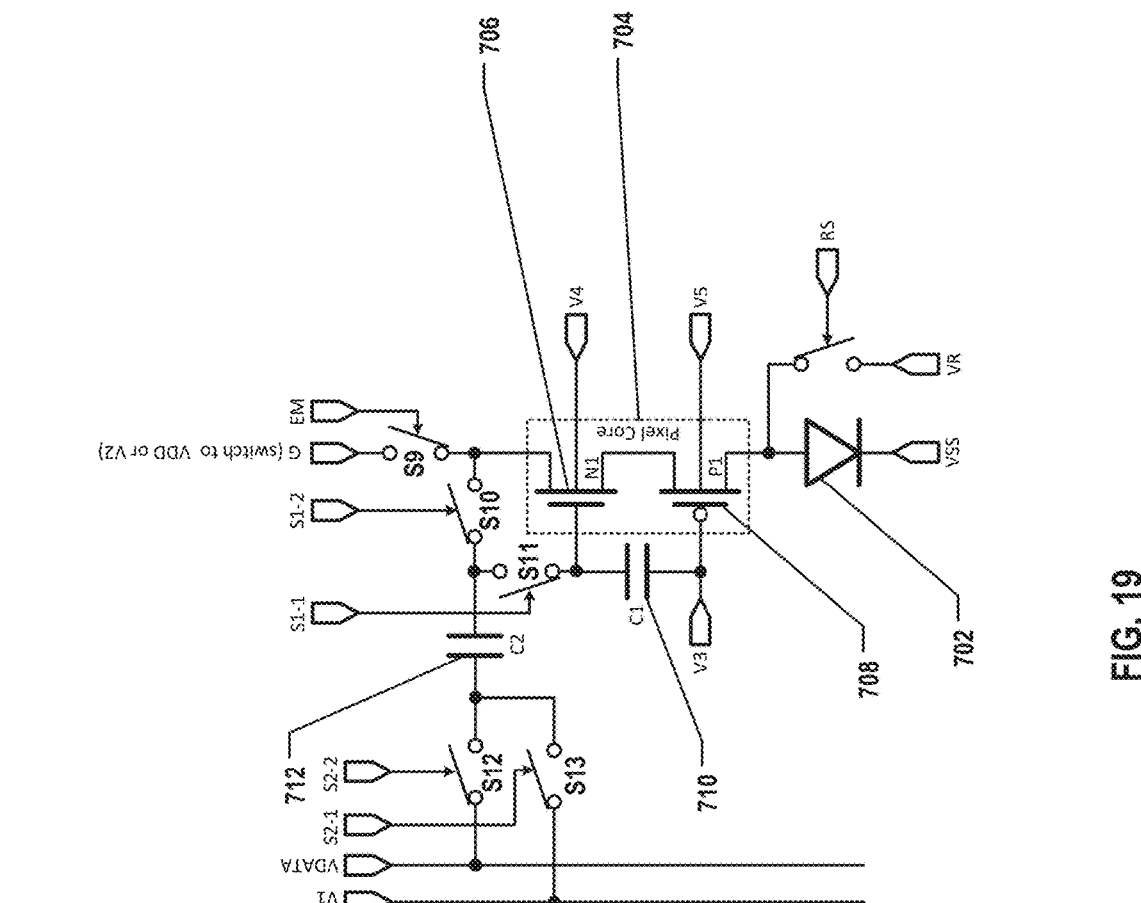
FIG. 19 illustrates a circuit diagram of a pixel driving circuit for a light emitting element, according to some aspects of the present disclosure.
Figure 20:
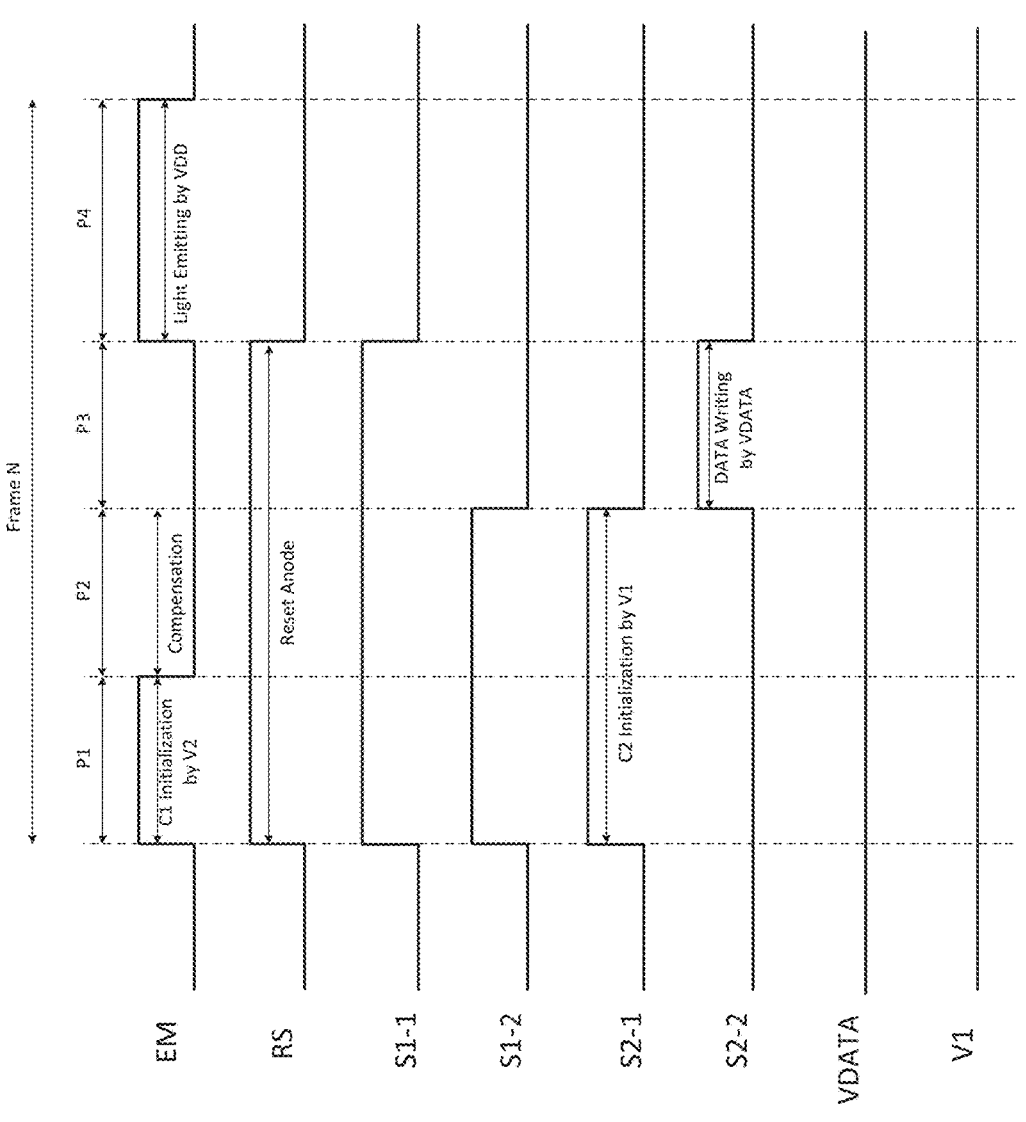
FIG. 20 illustrates a timing diagram showing the operations of the pixel driving circuit in FIG. 19, according to some aspects of the present disclosure.

FIG. 19 illustrates a circuit diagram of another pixel driving circuit 1900 for a light emitting element 702, according to some aspects of the present disclosure. FIG. 20 illustrates a timing diagram showing the operations of pixel driving circuit 1900 in FIG. 19, according to some aspects of the present disclosure. For the purpose of better describing the present disclosure, pixel driving circuit 1900 in FIG. 19 and the timing diagram in FIG. 20 will be discussed together.

As shown in FIG. 19, a switch element S9 is disposed between a bias source G and the first drain terminal of first transistor 706, a switch element S10 is disposed between the first drain terminal of first transistor 706 and a first end of the second capacitor 712, and a switch element S11 is disposed between the first end of second capacitor 712 and the gate terminal of first transistor 706. In some implementations, driving sub-circuit 620 in FIG. 6 collectively includes switch element S9, switch element S10, and switch element S11 in FIG. 19. In some implementations, switch element S9, switch element S10, and switch element S11 may be achieved by using switching transistors or other suitable elements.

As shown in FIG. 19, switch element S12 is disposed between a second end of second capacitor 712 and a data signal source providing data signal VDATA, and switch element S13 is disposed between the second end of second capacitor 712 and a bias source V1. In some implementations, data-writing sub-circuit 630 in FIG. 6 may collectively include switch element S12 and switch element S13. In some implementations, switch element S12 and switch element S13 may be achieved by using switching transistors or other suitable elements.

As shown in FIG. 20, during the initialization period P1, the reset signal RS may connect the reset bias VR to the anode of light emitting element 702 to start the reset period, and the control signal S1-1 may turn on switch element S11 to connect the gate terminal of first transistor 706 with the first end of second capacitor 712. The control signal EM may turn on switch element S9 to provide a bias signal V2 to the drain terminal of first transistor 706. The control signal S1-2 may turn on switch element S10 to connect the first end of second capacitor 712 and the drain terminal of first transistor 706. The control signal S2-1 may turn on switch element S13 to connect the bias source V1 and the second end of second capacitor 712. In some implementations, during the initialization period P1, the first end of first capacitor 710 is initialized to a first initialization bias V2, and the first end of second capacitor 712 is initialized to a second initialization bias V1.

During the compensation period P2, the control signal EM may turn off switch element S9. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During a data writing period P3, the control signal S1-2 may turn off switch element S10, the control signal S2-1 may turn off switch element S13 to disconnect the bias source V1 and the second end of second capacitor 712, and the control signal S2-2 may turn on switch element S12. In some implementations, during the data writing period P3, the data signal VDATA is provided to the second end of second capacitor 712.

During the light emitting period P4, the reset signal RS may disconnect the reset bias VR from the anode of light emitting element 702 to start the light emitting period, the control signal EM may turn on switch element S9 again to provide the emitting voltage VDD, and the control signal S2-2 may turn off switch element S12. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 21:
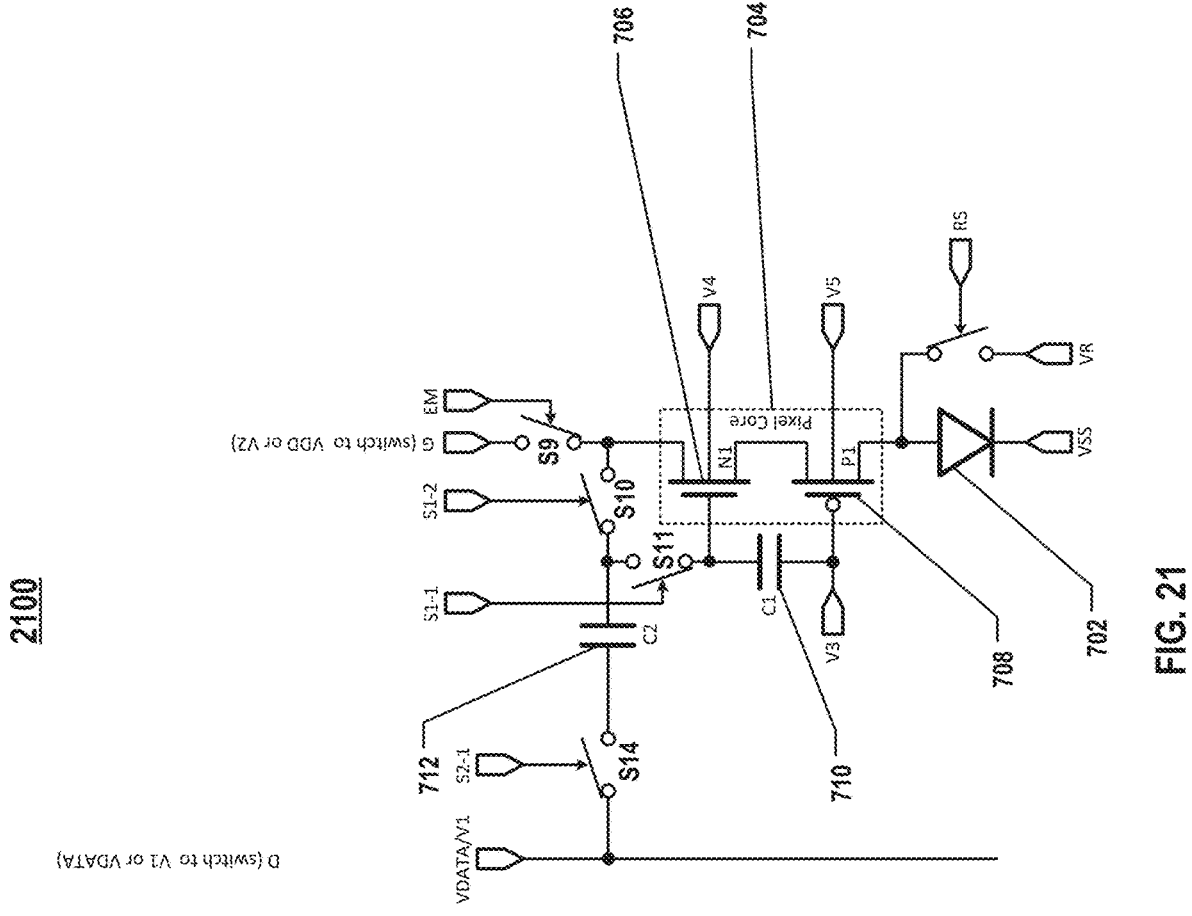
FIG. 21 illustrates a circuit diagram of a pixel driving circuit for a light emitting element, according to some aspects of the present disclosure.
Figure 22:
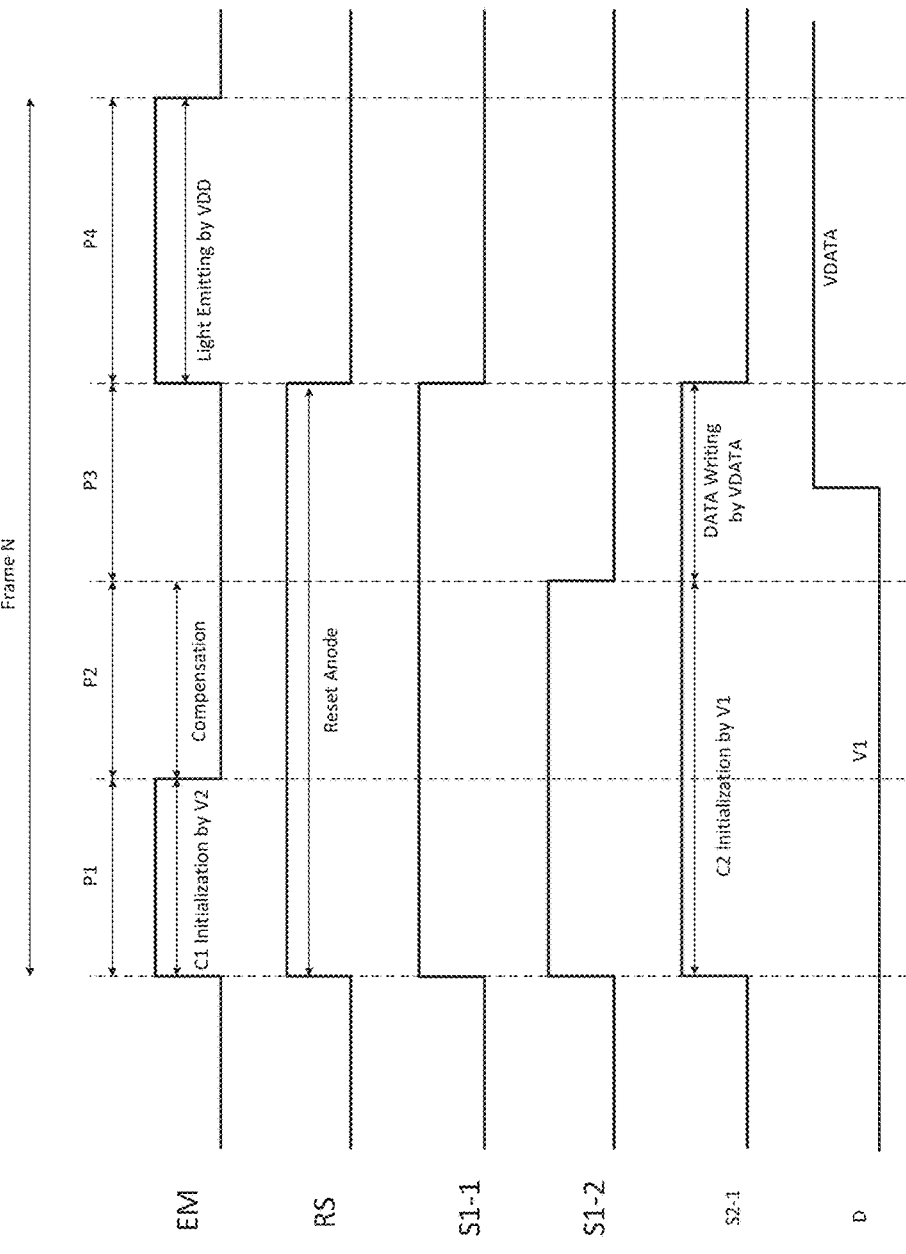
FIG. 22 illustrates a timing diagram showing the operations of the pixel driving circuit in FIG. 21, according to some aspects of the present disclosure.

FIG. 21 illustrates a circuit diagram of another pixel driving circuit 2100 for a light emitting element 702, according to some aspects of the present disclosure. FIG. 22 illustrates a timing diagram showing the operations of pixel driving circuit 2100 in FIG. 21, according to some aspects of the present disclosure. For the purpose of better describing the present disclosure, pixel driving circuit 2100 in FIG. 21 and the timing diagram in FIG. 22 will be discussed together.

As shown in FIG. 21, driving sub-circuit 620 in FIG. 6 collectively includes switch element S9, switch element S10, and switch element S11 in FIG. 21, and is similar to the circuit structure in FIG. 19. Data-writing sub-circuit 630 in FIG. 6 may include the switch element S14 in FIG. 21, and is similar to switch element S14 in FIG. 9.

As shown in FIG. 22, during the initialization period P1, the reset signal RS may connect the reset bias MR to the anode of light emitting element 702 to start the reset period, and the control signal S1-1 may turn on switch element S1 to connect the gate terminal of first transistor 706 with the first end of second capacitor 712. The control signal EM may turn on switch element S9 to provide a bias signal V2 to the drain terminal of first transistor 706. The control signal S1-2 may turn on switch element S10 to connect the first end of second capacitor 712 and the drain terminal of first transistor 706. The control signal S2-1 may turn on switch element S14 to connect a bias source D and the second end of second capacitor 712. In some implementations, during the initialization period P1, the first end of first capacitor 710 is initialized to a first initialization bias V2, and the first end of second capacitor 712 is initialized to a second initialization bias V1.

During the compensation period P2, the control signal EM may turn off switch element S9. In some implementations, during the compensation period P2, the gate terminal of first transistor 706, the first end of first capacitor 710, and the first end of second capacitor 712 are coupled to the drain terminal of first transistor 706. In some implementations, the initialization bias V2 at the gate terminal of first transistor 706, the first end of first capacitor 710, and the first end of second capacitor 712 is compensated with the drain terminal of first transistor 706.

During a data, writing period P3, the control signal S1-2 may turn off switch element S10. The control signal S2-1 may keep turning on the switch element S14. The bias source D is changed from proving the bias V1 to providing data signal VDATA.

During the light emitting period P4, the reset signal RS may disconnect the reset bias VP from the anode of light emitting element 702 to start the light emitting period, the control signal EM may turn on switch element S9 again to provide the emitting voltage VDD, and the control signal S2-1 may turn off switch element S14. In some implementations, during the light emitting period P4, the emitting voltage VDD may drive light emitting element 702 to emit based on the data signal VDATA.

With this circuit structure, the drain-to-gate voltage (VDG) of first transistor 706, the gate-to-drain voltage (VGD) of second transistor 708, the drain-to-body voltage (VDB) of first transistor 706, or the body-to-drain voltage (VBD) of second transistor 708 would be operated in a safe bias range when using a high (VDD–VSS) to drive light emitting element 702.

Figure 23:
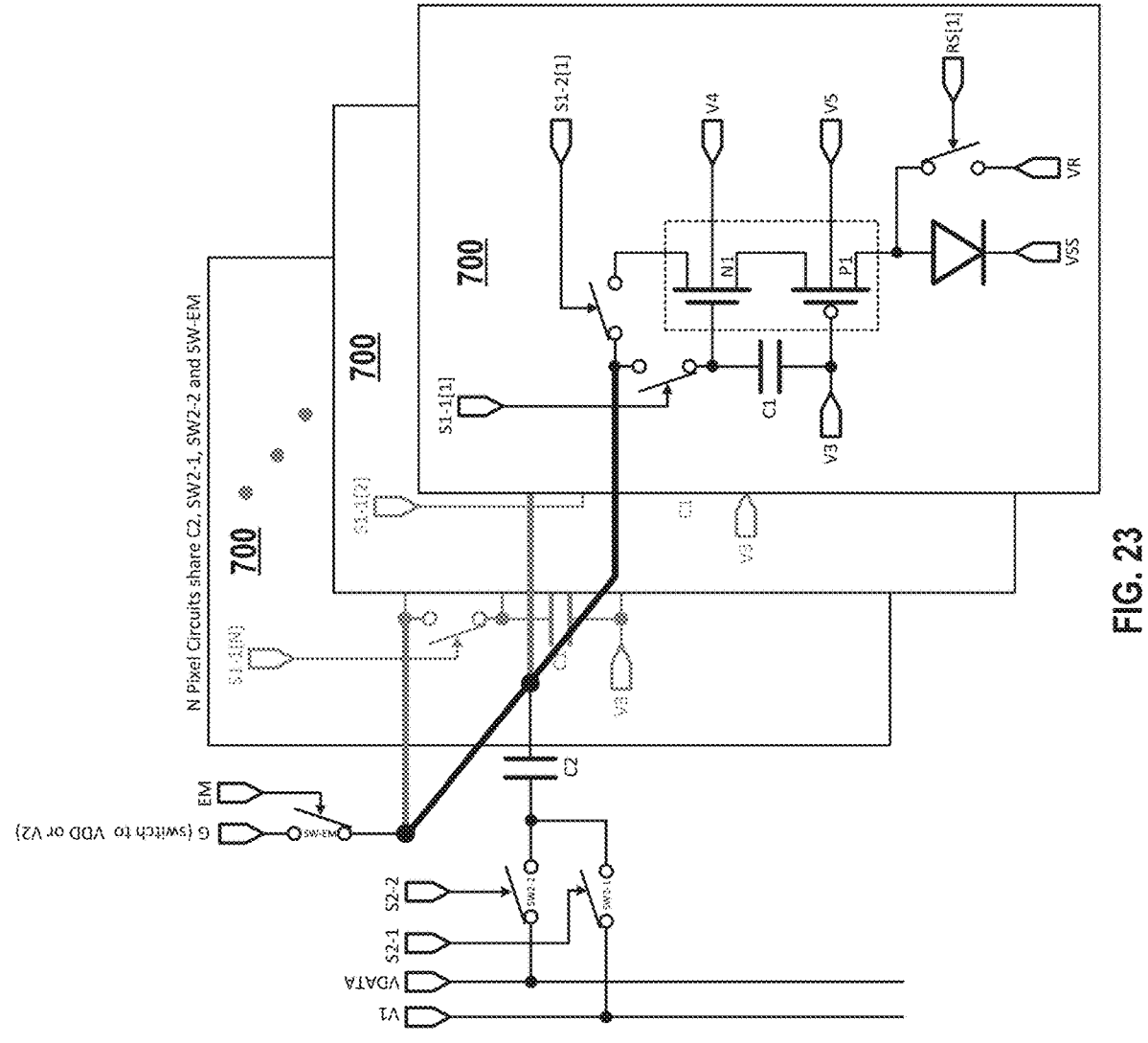
FIG. 23 illustrates an application of the pixel driving circuit 700, according to some aspects of the present disclosure.
Figure 24:
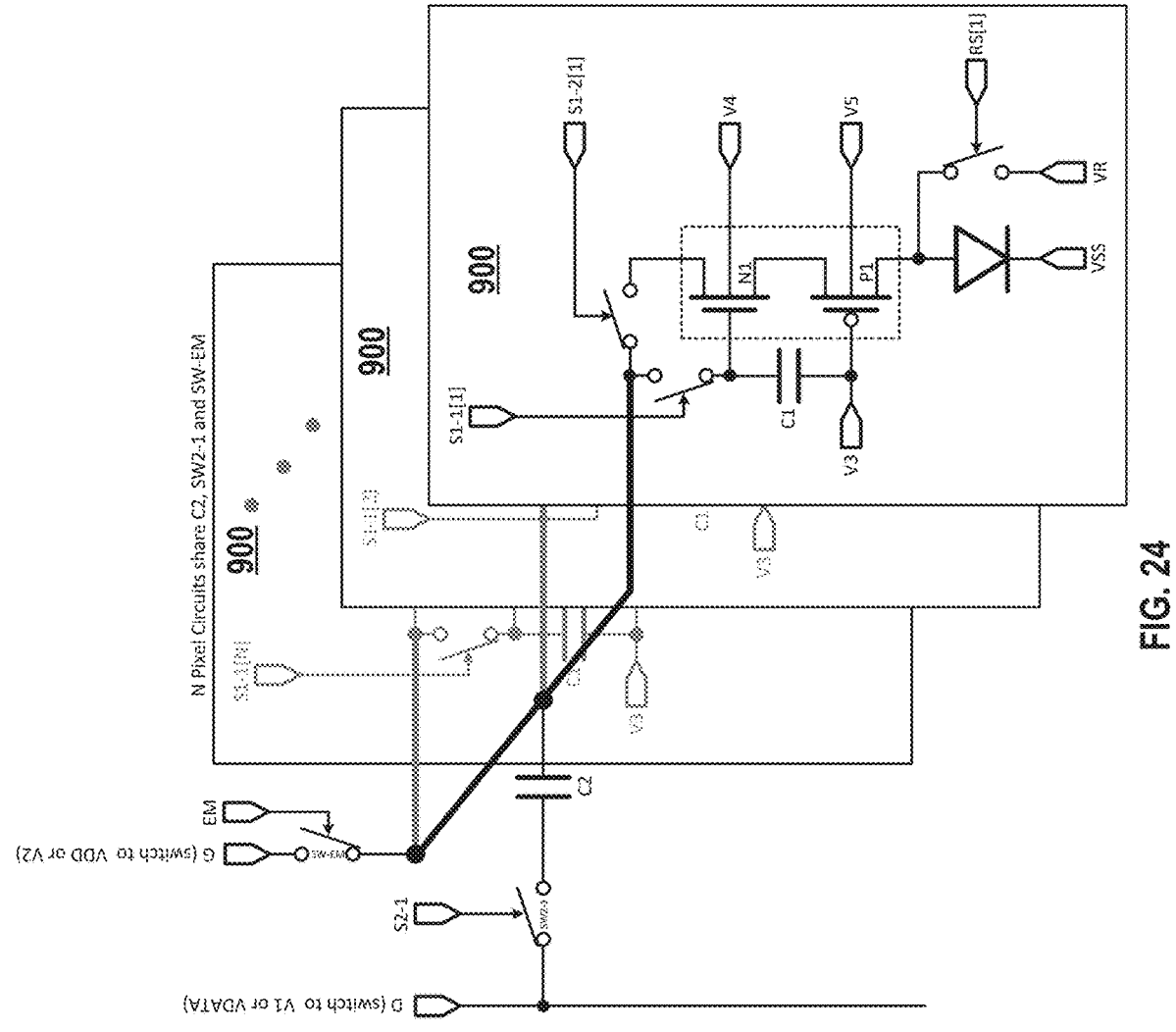
FIG. 24 illustrates an application of the pixel driving circuit 900, according to some aspects of the present disclosure.
Figure 25:
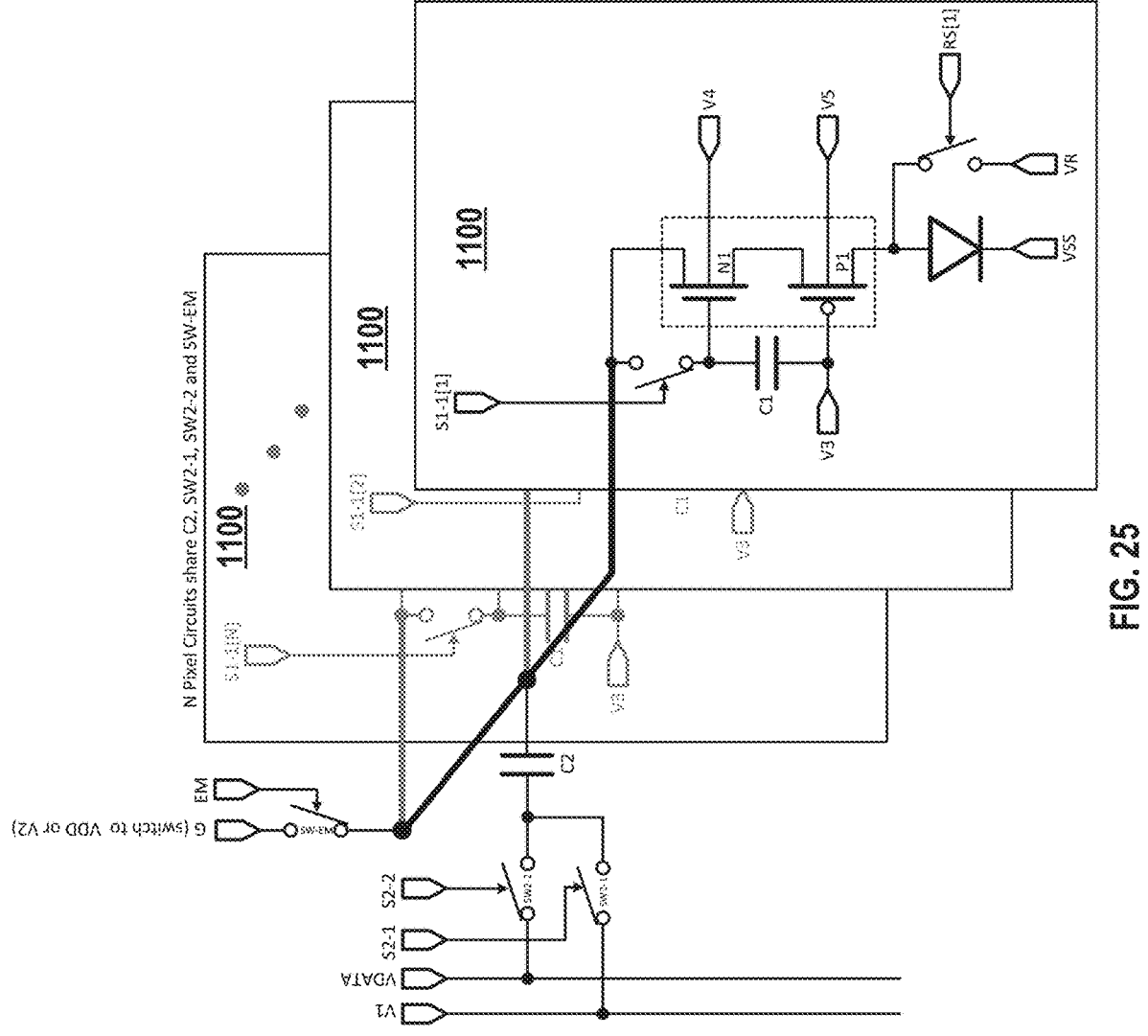
FIG. 25 illustrates an application of the pixel driving circuit 1100, according to some aspects of the present disclosure.

FIGS. 23-26 illustrate applications of the pixel driving circuit 700, 900, 1100, and 1300, according to some aspects of the present disclosure. As shown in FIGS. 23-26, one data-writing sub-circuit 630 could be coupled to multiple driving sub-circuit 620. In some implementations, as shown in FIGS. 23 and 25, one set of second capacitor 712, switch element S12, and switch element S13 could be shared by multiple driving sub-circuit 620 to drive multiple light emitting element 702.

Figure 26:
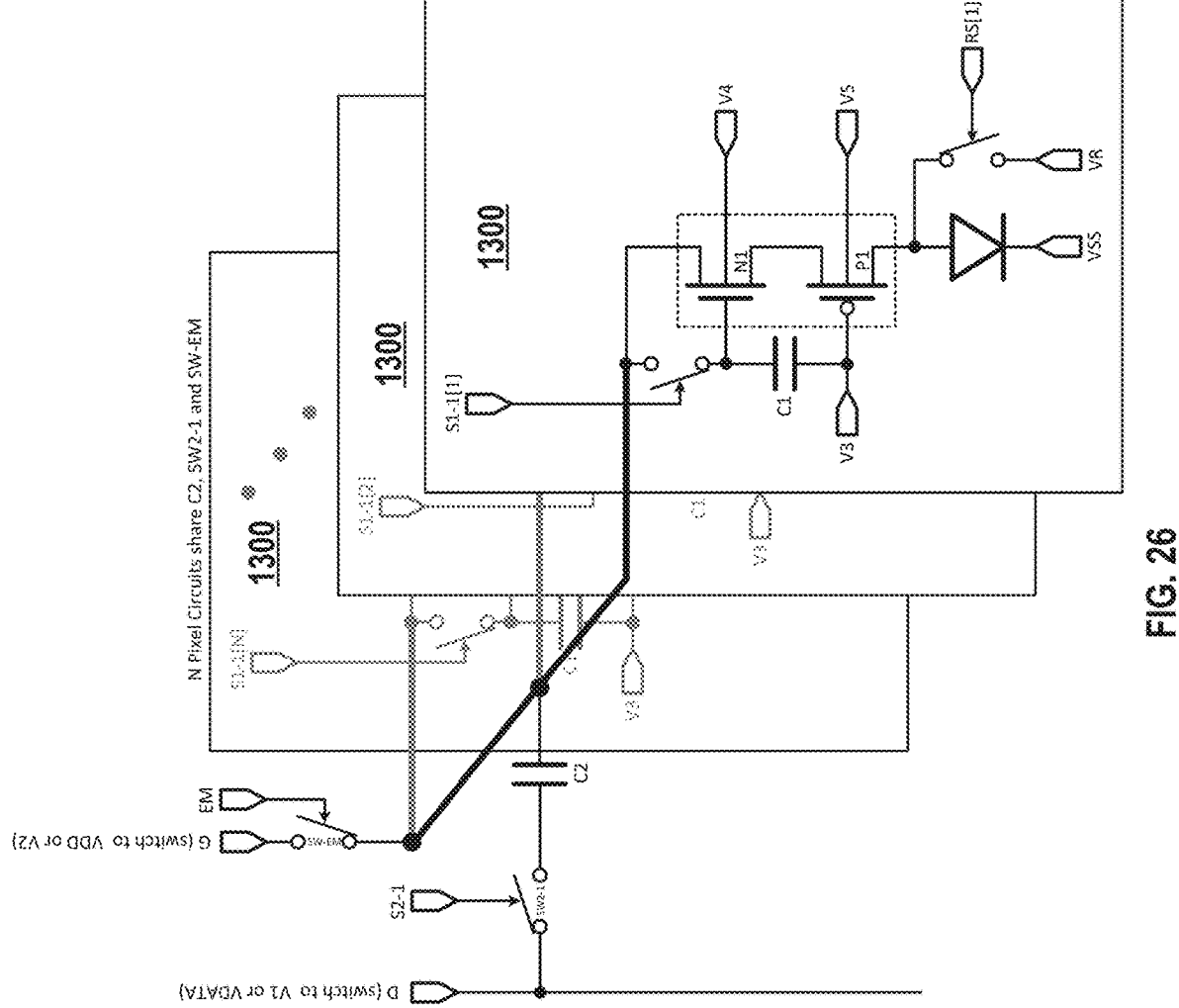
FIG. 26 illustrates an application of the pixel driving circuit 1300, according to some aspects of the present disclosure.

Similarly, as shown in FIGS. 24 and 26, one set of second capacitor 712 and switch element S14 could be shared by multiple driving sub-circuit 620 to drive multiple light emitting element 702. In addition, as shown in FIGS. 23-26, switch element S2 or switch element S4, which is coupled to the bias source G, could be shared by multiple driving sub-circuit 620 as well.

Figure 27:
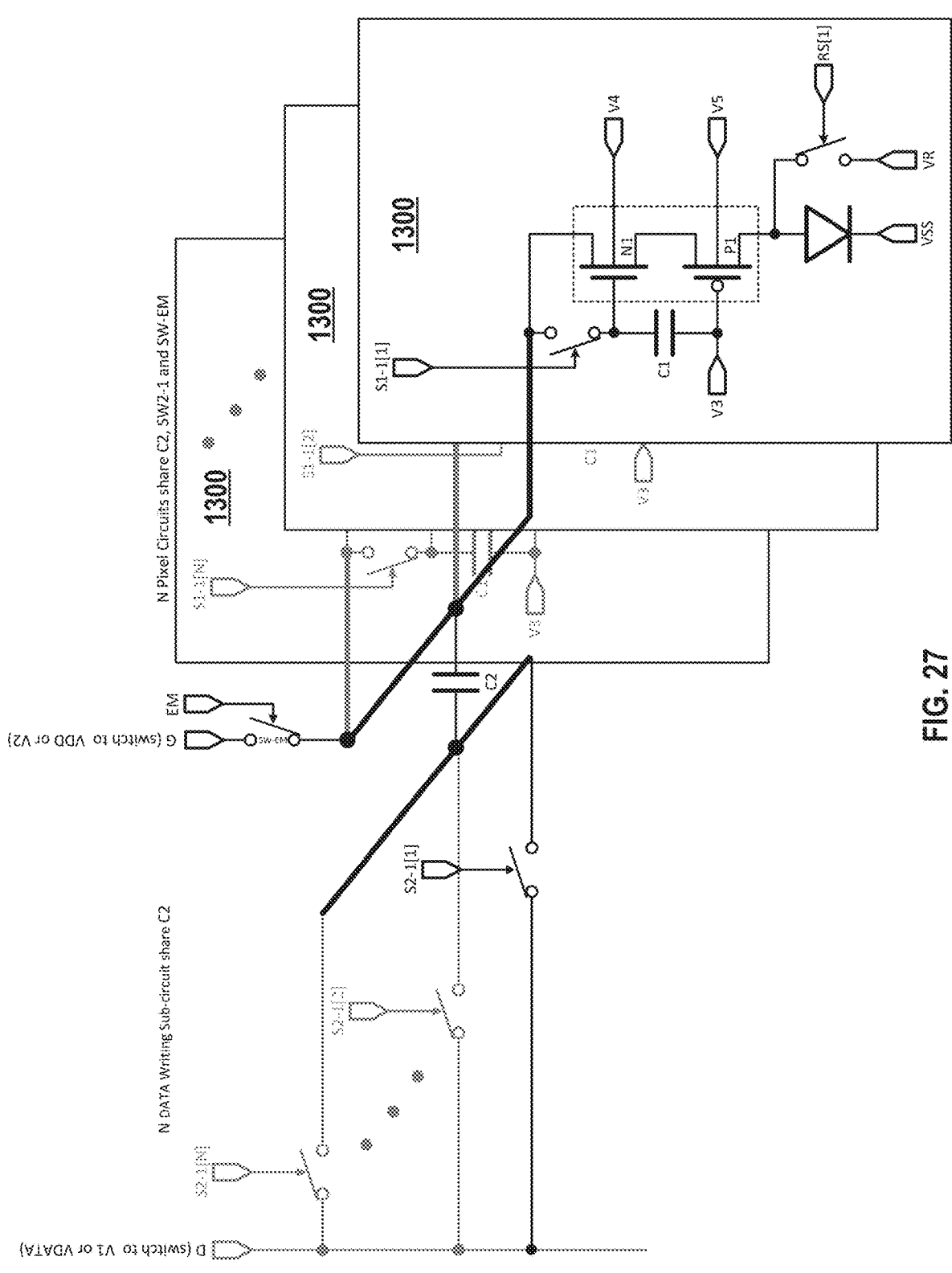
FIG. 27 illustrates an application of the pixel driving circuit 1300, according to some aspects of the present disclosure.
Figure 28:
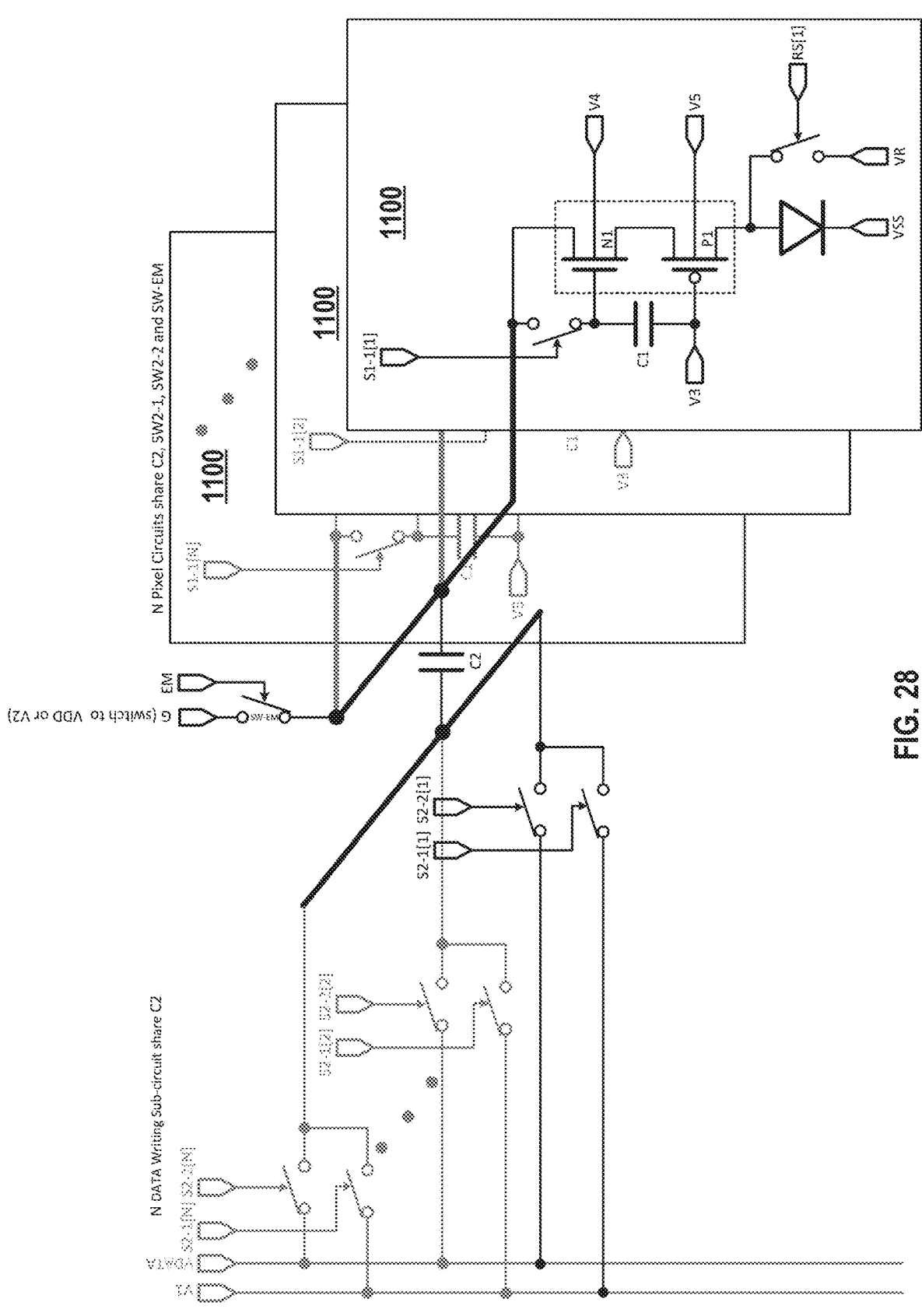
FIG. 28 illustrates an application of the pixel driving circuit 1100, according to some aspects of the present disclosure.

FIGS. 27 and 28 illustrate another application of the pixel driving circuit 1100 or 1300, according to some aspects of the present disclosure. As shown in FIGS. 27 and 28, one second capacitor 712 could be shared by multiple driving sub-circuits 620 and/or multiple data-writing sub-circuits 630.

Figure 29:
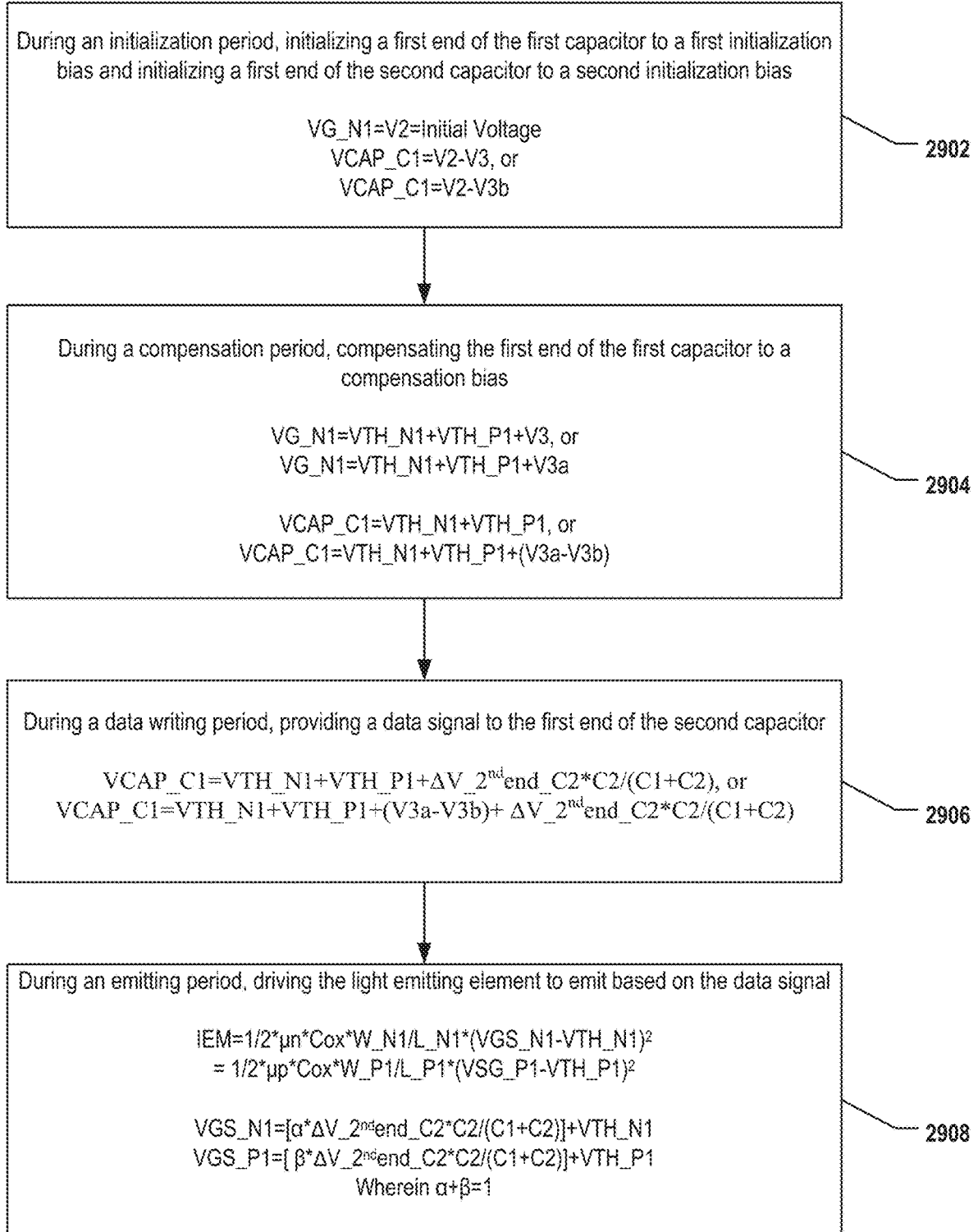
FIG. 29 illustrates a flowchart of a method for driving a light emitting element by a pixel circuit, according to some aspects of the present disclosure.

FIG. 29 illustrates a flowchart of a method 2900 for driving a light emitting element by a pixel circuit, according to some aspects of the present disclosure. The pixel circuit may include first transistor 706, second transistor 708 disposed between first transistor 706 and the light emitting element 702. The first capacitor 710 is disposed between a first gate terminal of first transistor 706 and a second gate terminal of second transistor, and the second capacitor 712 is disposed between the first transistor 706 and a data signal source VDATA.

As shown in operation 2902 in FIG. 29, during an initialization period, a first end of the first capacitor 710 is initialized to a first initialization bias V2, and a first end of the second capacitor 712 is initialized to a second initialization bias V1. Then, as shown in operation 2904 in FIG. 29, during a compensation period, the first end of the first capacitor 710 is compensated to a compensation bias. As shown in operation 2906 in FIG. 29, during a data writing period, a data signal is provided to the first end of the second capacitor 712. As shown in operation 2908 in FIG. 29, during an emitting period, the pixel driving circuit drives the light emitting element 702 to emit based on the data signal.

In some implementations, the pixel circuit may further include a reset bias source VR coupled to the second transistor 708 and the light emitting element 702. During the initialization period, the compensation period, and the data writing period, the reset bias VR is provided to the pixel circuit by the reset bias source.

In some implementations, a sum of the initialization period, the compensation period, the data writing period, and the emitting period is a frame period. In some implementations, the first initialization bias V2 is provided to the first end of the first capacitor 710, a first bias V3 is provided to the second end of the first capacitor 710. The second initialization bias V1 is provided to the first end of the second capacitor 712. The first end of the first capacitor 710 and a second end of the second capacitor are coupled together.

In some implementations, the first initialization bias V2 at the first end of the first capacitor 710 is discharged through the first transistor 706 and the second transistor 708 to the reset bias. The compensation bias is at least the sum of a first threshold voltage of the first transistor and a second threshold voltage of the second transistor.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A pixel driving circuit, comprising:
a first transistor configured to receive a data signal and drive a light emitting element based on the data signal, the first transistor comprising a first gate terminal, a first source terminal, and a first drain terminal;
a second transistor comprising a second gate terminal receiving a first bias signal from a first bias source, a second source terminal coupled to the first transistor, and a second drain terminal coupled to the light emitting element;
a first capacitor disposed between the first gate terminal and the second gate terminal, wherein the first transistor and the second transistor are different types of transistors;
a driving sub-circuit coupled to the first gate terminal and the first drain terminal to selectively provide a second bias signal by a third bias source to the first transistor; and
a data-writing sub-circuit coupled to the driving sub-circuit to selectively provide the data signal to the first transistor; and
a second capacitor disposed between the driving sub-circuit and the data-writing sub-circuit, wherein the second capacitor is selectively coupled to the first gate terminal and the first drain terminal through the driving sub-circuit.

2. The pixel driving circuit of claim 1, wherein a scan period of each display frame comprises a reset period and a light emitting period, the driving sub-circuit provides the second bias signal to the first transistor during the light emitting period to drive the light emitting element.

3. The pixel driving circuit of claim 2, wherein the reset period comprises an initialization period, a compensation period, and a data writing period, the driving sub-circuit provides a first initialization bias signal to the first capacitor during the initialization period.

4. The pixel driving circuit of claim 3, wherein the data-writing sub-circuit provides a second initialization bias signal to the second capacitor during the initialization period and the compensation period.

5. The pixel driving circuit of claim 3, wherein the data-writing sub-circuit provides the data signal to the first transistor during the data writing period.

6. The pixel driving circuit of claim 1, wherein the driving sub-circuit comprises:
a first switch element disposed between the first drain terminal and a first terminal of the second capacitor;
a second switch element disposed between the first terminal of the second capacitor and the third bias source; and
a third switch element disposed between the first terminal of the second capacitor and the first gate terminal.

7. The pixel driving circuit of claim 1, wherein the driving sub-circuit comprises:
a sixth switch element disposed between the first source terminal and the third bias source;
a seventh switch element disposed between the first source terminal and a first terminal of the second capacitor; and
an eighth switch element disposed between the first terminal of the second capacitor and a first initialization bias source.

8. The pixel driving circuit of claim 1, wherein the driving sub-circuit comprises:
a ninth switch element disposed between the first source terminal and the third bias source;
a tenth switch element disposed between the first source terminal and a first terminal of the second capacitor; and
an eleventh switch element disposed between the first terminal of the second capacitor and the first gate terminal.

9. The pixel driving circuit of claim 1, wherein the data-writing sub-circuit comprises:
a twelfth switch element disposed between a second terminal of the second capacitor and a data signal source; and
a thirteenth switch element disposed between the second terminal of the second capacitor and a second initialization bias source.

10. The pixel driving circuit of claim 1, wherein the data-writing sub-circuit and the second capacitor are shared by more than one driving sub-circuit.

11. The pixel driving circuit of claim 1, wherein the first bias source and a second bias source are provided by different voltage sources.

12. The pixel driving circuit of claim 1, wherein the first bias source and a second bias source are provided by a same voltage source.

13. A light emitting device, comprising:
a light emitting element; and
a driving circuit for driving the light emitting element, the driving circuit comprising:
a first type transistor receiving a data signal and comprising a first gate terminal, a first source terminal, and a first drain terminal;
a second type transistor comprising a second gate terminal receiving a first bias signal from a first bias source, a second source terminal coupled to the first drain terminal, and a second drain terminal coupled to the light emitting element;

a first capacitor disposed between the first gate terminal and the second gate terminal;

a driving sub-circuit coupled to the first gate terminal and the first source terminal to provide the data signal and a third bias signal by a third bias source;

a data-writing sub-circuit coupled to the driving sub-circuit to provide the data signal to the driving sub-circuit; and a second capacitor disposed between the driving sub-circuit and the data-writing sub-circuit, wherein the second capacitor is selectively coupled to the first gate terminal and the first drain terminal through the driving sub-circuit.

14. The light emitting device of claim 13 wherein the first type transistor is a p-type transistor, and the second type transistor is an n-type transistor.

15. A method for driving a light emitting element by a pixel circuit, wherein the pixel circuit comprises a first transistor, a second transistor disposed between the first transistor and the light emitting element, a first capacitor disposed between a first gate terminal of the first transistor and a second gate terminal of the second transistor, and a second capacitor comprising a second end connecting disposed between the first transistor and a first end connecting a data signal source, the method comprising:

during an initialization period, initializing a first end of the first capacitor to a first initialization bias and initializing a first end of the second capacitor to a second initialization bias;

during a compensation period, compensating the first end of the first capacitor to a compensation bias;

during a data writing period, providing a data signal to the first end of the second capacitor; and during an emitting period, driving the light emitting element to emit based on the data signal.

16. The method of claim 15, wherein the pixel circuit further comprises a reset bias source coupled to the second transistor and the light emitting element, and the method further comprises:

during the initialization period, the compensation period, and the data writing period, providing a reset bias to the pixel circuit by the reset bias source.

17. The method of claim 15, wherein a sum of the initialization period, the compensation period, the data writing period, and the emitting period is a frame period.

18. The method of claim 16, wherein initializing the first end of the first capacitor to the first initialization bias and initializing the first end of the second capacitor to the second initialization bias, comprises:

providing the first initialization bias to the first end of the first capacitor;

providing a first bias to a second end of the first capacitor;

providing the second initialization bias to the first end of the second capacitor; and coupling the first end of the first capacitor and a second end of the second capacitor.

19. The method of claim 18, wherein compensating the first end of the first capacitor to the compensation bias, comprises:

discharging the first initialization bias at the first end of the first capacitor through the first transistor and the second transistor to the reset bias.

* * * * *